(12) United States Patent
Kubo et al.

(10) Patent No.: US 9,129,914 B2
(45) Date of Patent: Sep. 8, 2015

(54) ELECTRONIC DEVICE, TEST BOARD, AND SEMICONDUCTOR DEVICE MANUFACTURING METHOD

(71) Applicant: Renesas Electronics Corporation, Shimonumabe, Nakahara-ku, Kawasaki-shi (JP)

(72) Inventors: Mitsuyuki Kubo, Kanagawa (JP); Junichi Yamada, Kanagawa (JP); Hiroshi Homma, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/493,877

(22) Filed: Sep. 23, 2014

(65) Prior Publication Data
US 2015/0084051 A1   Mar. 26, 2015

(30) Foreign Application Priority Data
Sep. 26, 2013   (JP) ................. 2013-200005

(51) Int. Cl.
*H01L 23/58* (2006.01)
*H01L 21/66* (2006.01)
(Continued)

(52) U.S. Cl.
CPC .............. *H01L 22/32* (2013.01); *G01R 1/0408* (2013.01); *H01L 22/14* (2013.01); *H01L 23/642* (2013.01); *H05K 1/0231* (2013.01); *H01L 23/3128* (2013.01); *H01L 23/50* (2013.01); *H01L 24/05* (2013.01); *H01L 24/13* (2013.01); *H01L 24/16* (2013.01); *H01L 24/32* (2013.01); *H01L 24/48* (2013.01); *H01L 24/73* (2013.01); *H01L 24/92* (2013.01); *H01L 24/94* (2013.01); *H01L 2224/02381* (2013.01); *H01L 2224/0401* (2013.01); *H01L 2224/04042* (2013.01); *H01L 2224/05548* (2013.01); *H01L 2224/05567* (2013.01); *H01L 2224/131* (2013.01); *H01L 2224/13022* (2013.01); *H01L 2224/16227* (2013.01); *H01L 2224/16235* (2013.01); *H01L 2224/32225* (2013.01); *H01L 2224/451* (2013.01); *H01L 2224/48091* (2013.01);
(Continued)

(58) Field of Classification Search
CPC ......... H01L 22/12; H01L 22/20; H01L 22/34; H01L 22/32; H01L 22/14; H01L 22/26; H01L 2924/01079; H01L 2924/01013
USPC .............. 257/48, 685, 686, 698, 778; 438/14
See application file for complete search history.

(56) References Cited

U.S. PATENT DOCUMENTS
7,038,142 B2 *   5/2006   Abe ................................ 174/255

FOREIGN PATENT DOCUMENTS
JP   2011-066344   3/2011
JP   2012-220438   11/2012

*Primary Examiner* — Quoc Hoang
(74) *Attorney, Agent, or Firm* — Womble Carlyle

(57) ABSTRACT

Electrical characteristics of a mounting board over which a semiconductor device is mounted is improved. A mounting board (wiring board) includes a plurality of first through holes and second through holes extending from its upper surface bearing a semiconductor device (semiconductor package) to its lower surface and through-hole wirings formed in the respective through holes. The mounting board has a capacitor arranged on its lower surface and electrically connected with the semiconductor device via second electrodes. Among a plurality of first electrodes formed on the upper surface of the mounting board, the several first electrodes to be connected with the capacitor are connected with one wiring formed in a first through hole with a larger diameter than a signal transmission path.

18 Claims, 14 Drawing Sheets

(51) Int. Cl.
  *G01R 1/04* (2006.01)
  *H01L 23/64* (2006.01)
  *H05K 1/02* (2006.01)
  *H01L 23/31* (2006.01)
  *H01L 23/50* (2006.01)
  *H01L 23/00* (2006.01)

(52) U.S. Cl.
  CPC ............... *H01L2224/48227* (2013.01); *H01L 2224/73204* (2013.01); *H01L 2224/73265* (2013.01); *H01L 2224/92247* (2013.01); *H01L 2224/94* (2013.01); *H01L 2924/1431* (2013.01); *H01L 2924/1434* (2013.01); *H01L 2924/15311* (2013.01); *H01L 2924/15313* (2013.01)

ELECTRONIC DEVICE, TEST BOARD, AND SEMICONDUCTOR DEVICE MANUFACTURING METHOD

CROSS-REFERENCE TO RELATED APPLICATIONS

The disclosure of Japanese Patent Application No. 2013-200005 filed on Sep. 26, 2013 including the specification, drawings and abstract is incorporated herein by reference in its entirety.

BACKGROUND

The present invention relates to technology for an electronic device or test board and more particularly to technology for an electronic device with a semiconductor package mounted over a mounting board or for a test board over which a semiconductor package is mounted in order to conduct an electrical test on the semiconductor package.

Japanese Unexamined Patent Application Publication No. 2011-66344 describes an electronic device in which a semiconductor device is mounted over the upper surface of a mounting board and a bypass capacitor electrically connected with the semiconductor device is mounted on the lower surface of the mounting board.

Japanese Unexamined Patent Application Publication No. 2012-220438 describes that a semiconductor device is mounted over a test board to conduct an electrical test on the semiconductor package.

SUMMARY

The present inventors examined the board (mother board or mounting board) of an electronic device with a bypass capacitor mounted thereon as described in Japanese Unexamined Patent Application Publication No. 2011-66344 or the board (test board) used to inspect a semiconductor package (semiconductor device) as described in Japanese Unexamined Patent Application Publication No. 2012-220438.

One technique to suppress voltage fluctuations of the power supplied to the semiconductor package mounted over the board as mentioned above is that a capacitor (called a bypass capacitor) is connected between power supply voltage and reference voltage. For the purpose of suppressing voltage fluctuations of the supplied power, it is desirable to shorten the transmission path for connecting between the capacitor and semiconductor package. For the purpose of shortening the transmission path, for example, it is desirable to fix the semiconductor package and capacitor on the board as follows: the semiconductor package is mounted over the upper surface of the board and the capacitor is arranged on the lower surface of the board in a way to overlap the semiconductor package in the thickness direction of the board. Also it is desirable to connect the semiconductor package and capacitor electrically by means of a through-hole wiring (wiring formed inside a through hole in the board) passing through the board from the upper surface of the board to its lower surface in the thickness direction of the board.

As a result of examination of the above techniques, the present inventors have found the following problem. When the semiconductor package is smaller, there is a tendency that the pitch (interval) between external terminals of the semiconductor package is smaller. Accordingly, in that case, the pitch (interval) between electrodes electrically connected with the external terminals of the semiconductor package should also be smaller. Furthermore, in that case, the diameter of the through-hole wiring for connecting between the semiconductor package and capacitor must be smaller. However, the board on which the semiconductor package is fixed must be sturdy enough to bear various electronic components including the semiconductor package and capacitor, so it is difficult to perform micro-fabrication to cope with the trend toward smaller semiconductor packages.

The above and further objects and novel features of the invention will more fully appear from the following detailed description in this specification and the accompanying drawings.

According to one aspect of the present invention, there is provided an electronic device which includes a first wiring board having a first surface over which a semiconductor package is fixed, a plurality of first electrodes formed on the first surface, a second surface opposite to the first surface, and a plurality of second electrodes formed on the second surface. The first wiring board has a plurality of holes extending from one of the first surface and the second surface to the other surface and wirings formed in the respective holes. The electronic device has a capacitor arranged on the second surface of the first wiring board and electrically connected with the semiconductor package via the second electrodes. Among the first electrodes, the several first electrodes to be connected with the capacitor are connected with one wiring formed in a hole with a larger diameter than a signal transmission path.

According to the present invention, the electrical characteristics of a wiring board over which a semiconductor device is mounted are improved.

DETAILED DESCRIPTION

Rules of Description in the Specification

Figure 1:
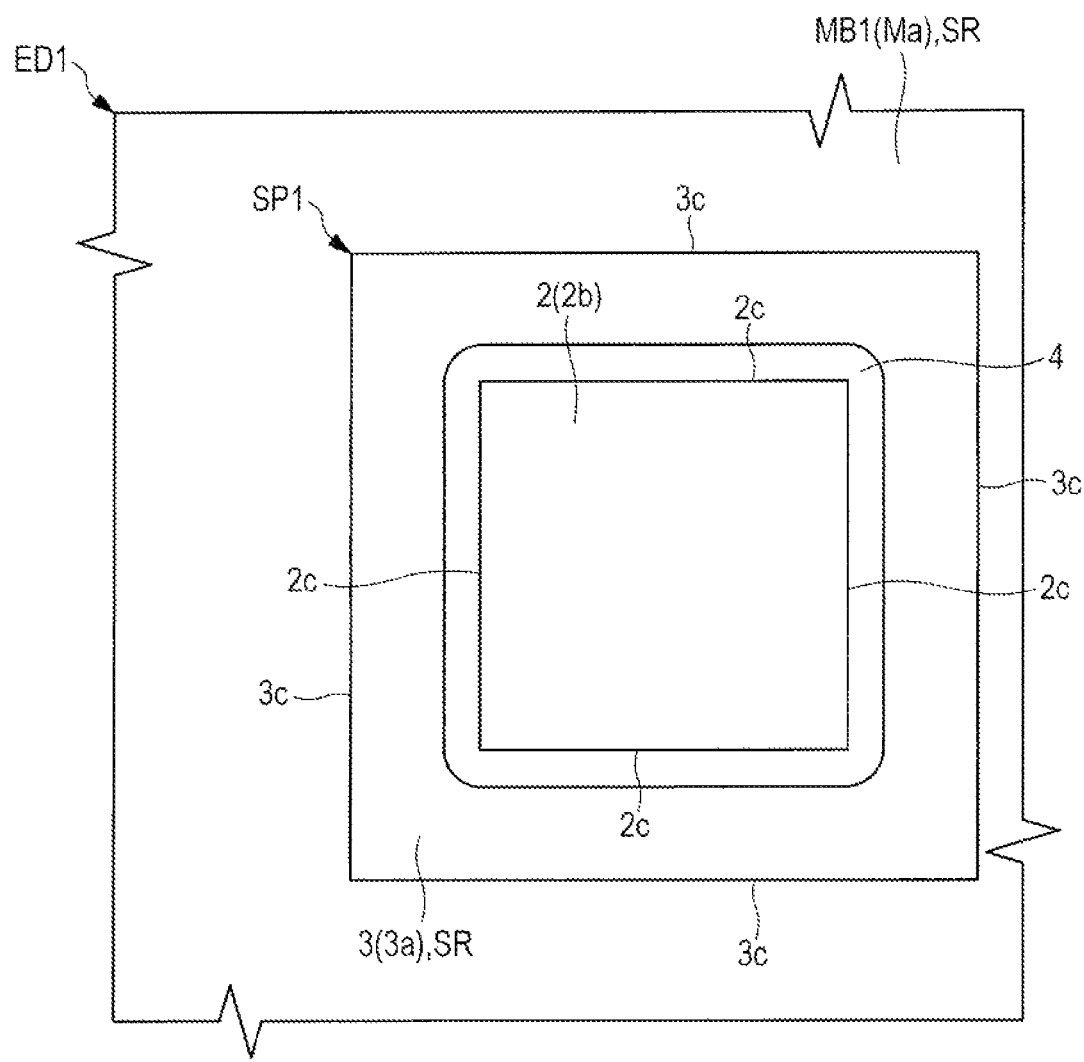
FIG. 1 is an enlarged fragmentary plan view showing the semiconductor package mounting surface of an electronic device according to an embodiment of the present invention.

The preferred embodiments of the present invention may be described separately in different sections as necessary or for convenience sake, but the embodiments described as such are not irrelevant to each other unless otherwise expressly stated. Regardless of the order in which they are described, one embodiment may be, in part, a detailed form of another, or one embodiment may be, in whole or in part, a variation of another. Basically, descriptions of the same elements or things are not repeated. In the preferred embodiments, when a specific numerical value is indicated for an element, the numerical value is not essential for the element unless otherwise expressly stated or unless theoretically limited to the numerical value or unless obviously the context requires the element to be limited to the specific value.

In description of a material or composition in an embodiment of the invention, the expression "X comprising A" or "X which comprises A" does not exclude a material or composition which includes an element other than A unless otherwise expressly stated or unless obviously the context requires exclusion of another element. If the expression concerns a component, it means "X which contains A as a main component". For example, the term "silicon member" obviously refers to not only a member made of pure silicon but also a member made of SiGe (silicon germanium) alloy or another type of multi-component alloy which contains silicon as a main component or a member which contains another additive. Similarly, for example, the terms "gold plating," "Cu layer," and "nickel plating" obviously refer to not only members of pure gold, Cu and nickel but also members made of multi-component material which contains gold, Cu and nickel as main components, respectively.

Also, even when a specific numerical value or quantity is indicated for an element, the numerical value or quantity of the element may be larger or smaller than the specific numerical value or quantity unless otherwise expressly stated or unless theoretically limited to the specific value or quantity or unless the context requires it to be limited to the specific value or quantity.

In all the drawings that illustrate the preferred embodiments, the same or similar elements are designated by the same or similar reference signs or numerals and basically descriptions thereof are not repeated.

In this specification, the terms "upper surface" and "lower surface" are sometimes used. The semiconductor package is embodied in various forms and after the semiconductor package is mounted over the board, there may be cases that its upper surface is arranged below its lower surface. In this specification, the surface on which semiconductor chip elements are formed is referred to as the front surface and the surface opposite to the front surface is referred to as the back surface. Also, the flat surface of the wiring board over which a chip is mounted is referred to as the upper surface or front surface and the surface opposite to the upper surface is referred to as the lower surface.

Regarding the accompanying drawings, hatching or the like may be omitted even in a cross section diagram if hatching may cause the diagram to look complicated or it is easy to distinguish the area concerned from an air gap. In connection with this, background contour lines may be omitted even for a closed hole in plan view if the contour of the hole is apparent from an explanation, etc. Furthermore, even if a drawing does not show a cross section, hatching or a dot pattern may be added to clarify that the area concerned is not an air gap or to show the border of an area clearly.

Electronic Device

Figure 2:
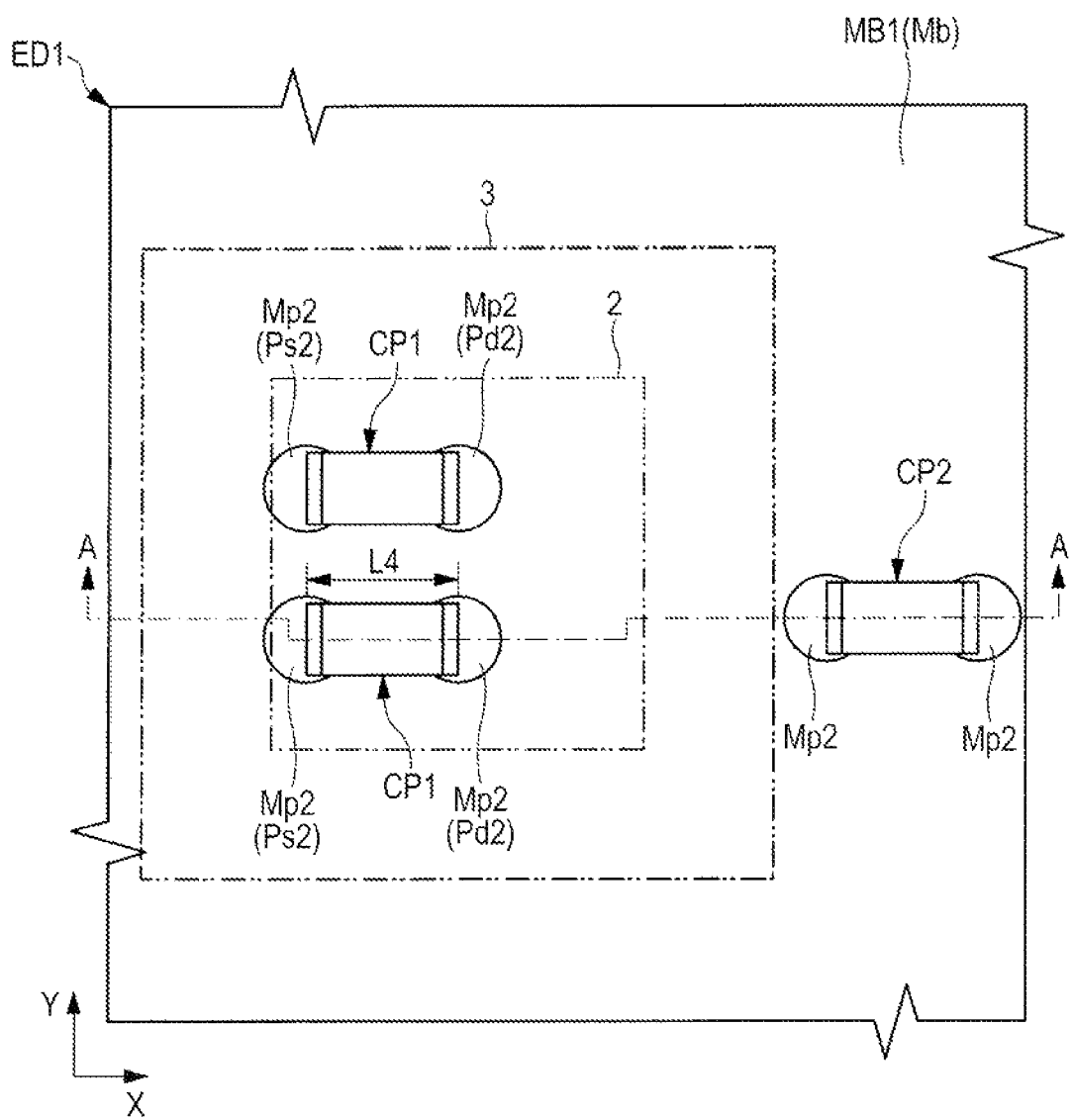
FIG. 2 is an enlarged plan view showing the opposite surface of the mounting board shown in FIG. 1.
Figure 3:
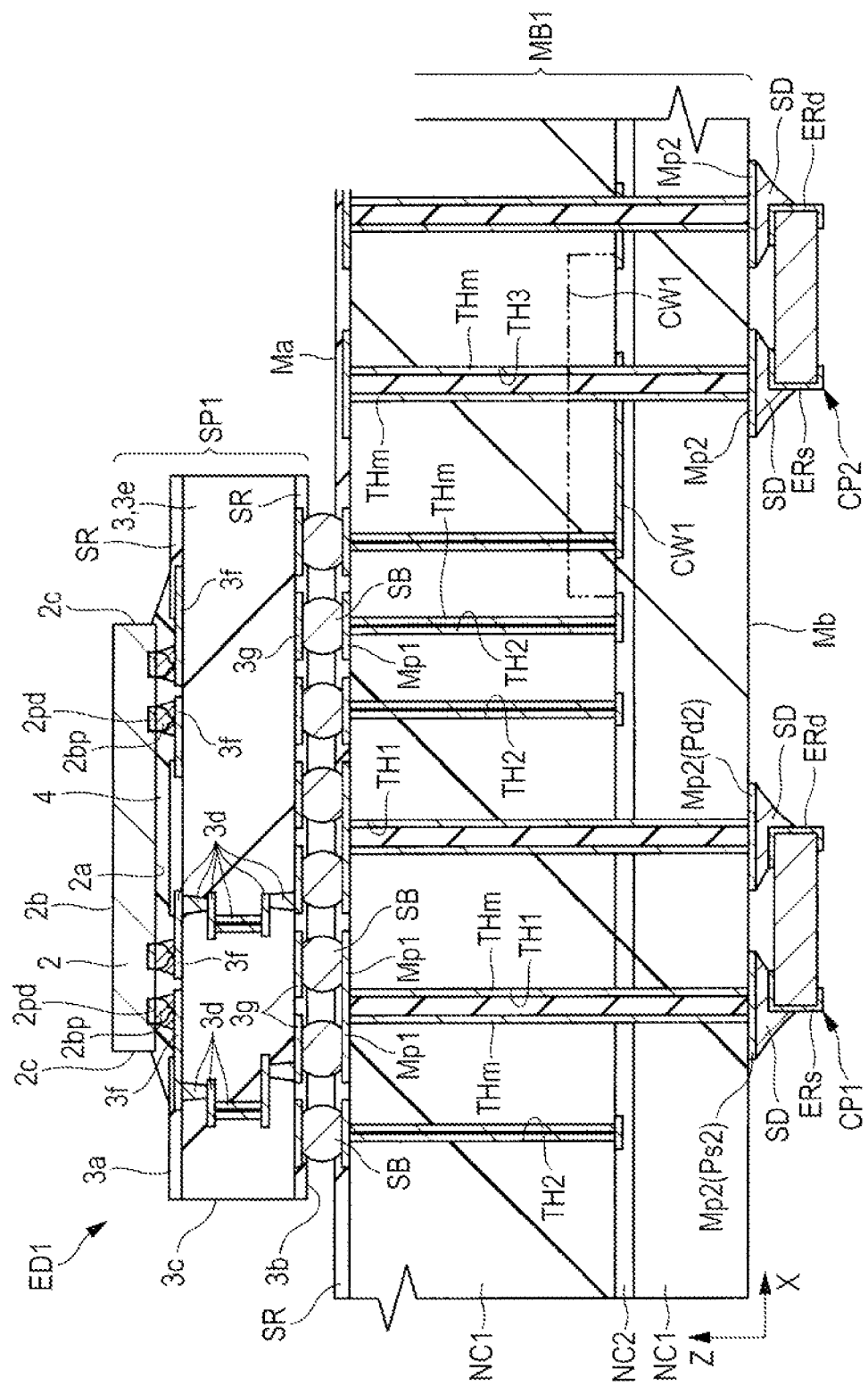
FIG. 3 is an enlarged sectional view taken along the line A-A of FIG. 2.
Figure 4:
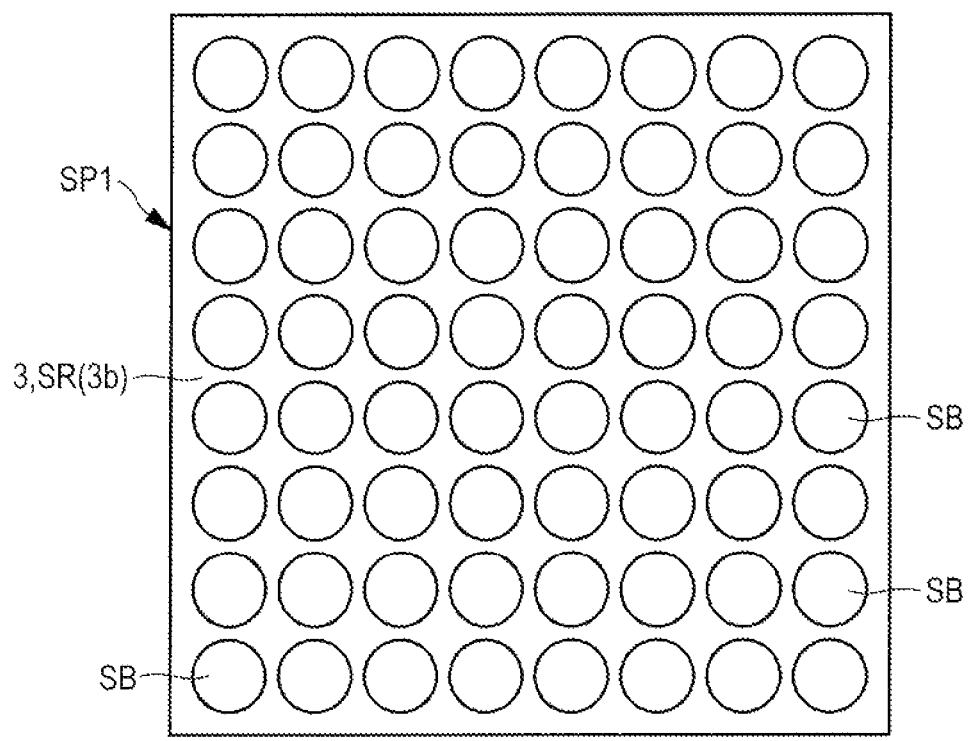
FIG. 4 is a plan view of the mounting surface of the semiconductor device shown in FIG. 3.
Figure 5:
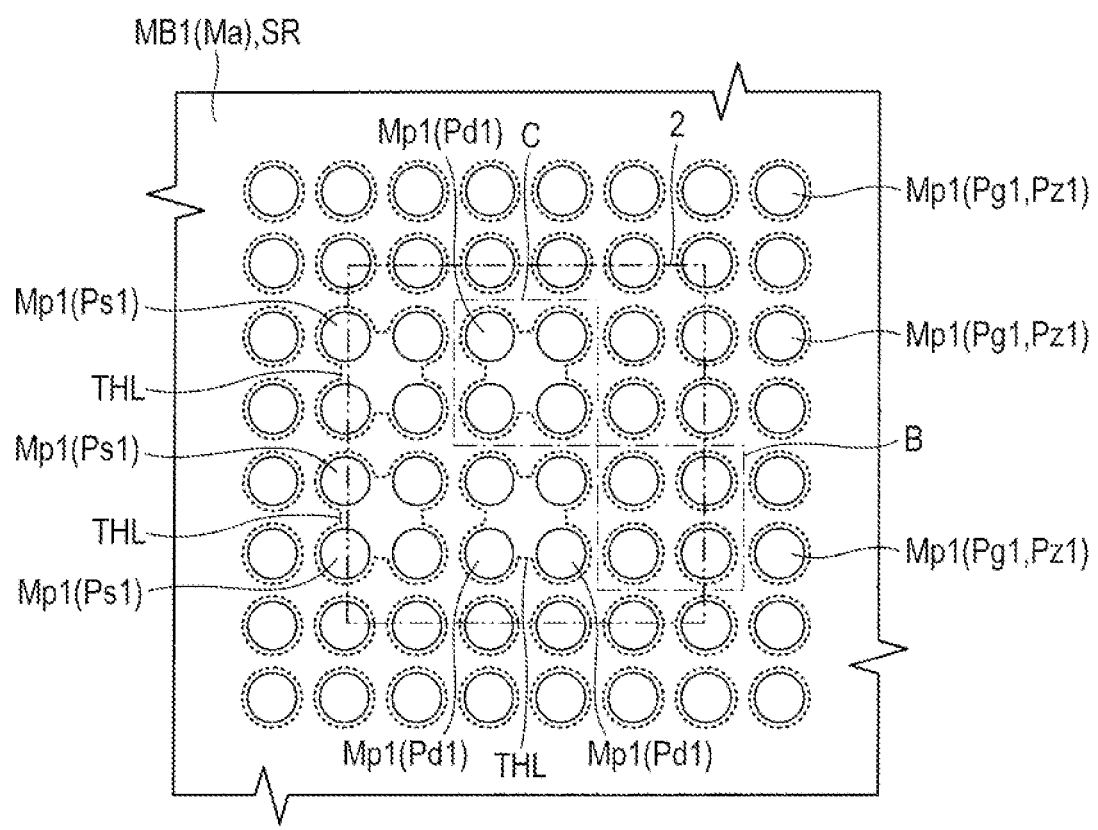
FIG. 5 is an enlarged plan view of the semiconductor package mounting surface of the mounting board shown in FIG. 3.

First of all, the general structure of an electronic device according to a preferred embodiment of the present invention will be described. FIG. 1 is an enlarged fragmentary plan view showing the semiconductor package mounting surface of the electronic device according to the preferred embodiment and FIG. 2 is an enlarged plan view showing the opposite surface of the mounting board shown in FIG. 1. FIG. 3 is an enlarged sectional view taken along the line A-A of FIG. 2. FIG. 4 is a plan view showing the mounting surface of the semiconductor device shown in FIG. 3. FIG. 5 is an enlarged plan view showing the semiconductor package mounting surface of the mount board shown in FIG. 3. In order to ensure that electrodes and terminals are easy to see, the drawings which illustrate this embodiment each show an example that the number of terminals is small and the planar size of each terminal is relatively large. In FIG. 2, the outline of the semiconductor chip 2 is indicated by chain double-dashed line in order to show the positional relation between the electrodes Mp1 and Mp2 of a mounting board MB1 and the semiconductor chip 2 in plan view. In FIG. 2, the outline of a wiring board 3 is also indicated by chain double-dashed line.

As shown in FIGS. 1 and 2, the electronic device ED1 according to this embodiment includes a mounting board (board, mother board, wiring board, supporting board) MB1 and a semiconductor device (semiconductor package) SP1 mounted over the mounting board. As shown in FIG. 2, the electronic device ED1 includes at least one capacitor (capacitive element, chip capacitor) CP1 which is mounted over the mounting board MB1.

The semiconductor device SP1 is a semiconductor package which includes a semiconductor chip 2 with a semiconductor integrated circuit formed thereon and a wiring board 3 with a plurality of solder balls SB as external terminals electrically connected with the semiconductor integrated circuit.

As shown in FIG. 3, the semiconductor chip 2 has a front surface (main surface, upper surface) $2a$, a back surface $2b$ (main surface, lower surface) opposite to the front surface $2a$, and side surfaces $2c$ arranged between the front surface $2a$ and back surface $2b$, taking a square form in plan view. As for the planar size of the semiconductor chip 2 (dimensions in plan view, the dimensions of the front surface $2a$ and back surface $2b$, outside dimensions), the length of one side is, for example, approximately 5 to 10 mm. The semiconductor chip 2 has a plurality of semiconductor elements formed on the semiconductor element bearing surface of the semiconductor board, for example, of silicon (Si). These semiconductor elements are electrically connected with a plurality of pads (electrodes, electrode pads) $2pd$ formed on the front surface $2a$ via wiring layers stacked over the semiconductor elements. A plurality of circuits including the semiconductor elements and the wiring layers connected with the semiconductor elements are formed in the semiconductor chip 2. Among these circuits are a main circuit (core circuit) for the main function of the semiconductor chip 2 such as an arithmetic processing circuit or memory circuit, and an input/output circuit to receive electric signals from the semiconductor chip 2 and transmit electric signals to the semiconductor chip 2.

The wiring board 3 has an upper surface (surface, chip mounting surface) $3a$ over which the semiconductor chip 2 is mounted, a lower surface $3b$ (surface, mounting surface)

opposite to the upper surface 3a, and side surfaces 3c arranged between the upper surface 3a and lower surface 3b, taking a square form in plan view. As for the planar size of the wiring board 3 (dimensions in plan view, dimensions of the upper surface 3a and lower surface 3b, outside dimensions), the length of one side is, for example, approximately 10 to 20 mm. The thickness of the wiring board 3, namely the distance from the upper surface 3a to the lower surface 3b is, for example, approximately 0.2 to 2.0 mm.

The wiring board 3 is an interposer which is used to adjust the positions of terminals in plan view so as to connect the semiconductor chip 2 mounted over the upper surface 3a and the mounting board MB1 electrically. A plurality of bonding fingers (terminals, chip mounting surface side terminals, electrodes, bonding leads) 3f electrically connected with the semiconductor chip 2 are formed on the upper surface 3a as the chip bearing surface of the wiring board 3.

In addition, a plurality of lands 3g are formed on the lower surface 3b as the mounting surface which is to be mounted over the mounting board MB1. The bonding fingers 3f and the lands 3g are electrically connected via a plurality of wirings 3d formed in wiring layers to connect the upper surface 3a with the lower surface 3b electrically. The wirings 3d include lead wires formed on the upper or lower surface of an insulating layer 3e, and via wires (wires formed inside of the via holes of the insulating layer 3e) as interlayer conduction paths penetrating the insulating layer 3e in its thickness direction. In the example shown in FIG. 3, the wiring board 3 has four wiring layers. However, the number of wiring layers in the wiring board 3 is not limited to four as shown in FIG. 3 and it may be not more than three or not less than five.

In the example shown in FIG. 3, the front surface 2a of the semiconductor chip 2 faces the upper surface 3a of the wiring board 3. This type of mounting method is called the face-down mounting method (or flip-chip mounting method). In the face-down mounting method, the pads 2pd as interface terminals of the semiconductor chip 2 are electrically connected with the bonding fingers 3f as interface terminals of the wiring board 3 via bump electrodes (bumps) 2bf. Resin (underfill resin, insulating film) 4 of an insulating material lies between the front surface 2a of the semiconductor chip 2 and the upper surface 3a of the wiring board 3 and the areas around the electrical connecting points (bump electrodes 2bp) between the semiconductor chip 2 and the wiring board 3 are sealed with the resin 4.

In the face-down mounting method, metal wires (not shown) may be omitted in the electrical connecting paths between the wiring board 3 and the semiconductor chip 2 to shorten the connecting path length. This method eliminates the need for the formation of a wire loop, offering an advantage that the thickness of the semiconductor package can be decreased.

As a variation of the example shown in FIG. 3, the so-called face-up mounting method in which the back surface 2b of the semiconductor chip 2 faces the upper surface 3a of the wiring board 3 may be adopted to mount the semiconductor chip 2. In this method, the pads 2pd of the semiconductor chip 2 are electrically connected with the bonding fingers 3f of the wiring board 3 via wires (not shown). When the face-up mounting method is adopted, the semiconductor chip 2 and the wires connected with the semiconductor chip 2 are sealed with resin in order to prevent adjacent wires from touching each other.

A plurality of solder balls SB as external terminals of the semiconductor device SP1 are bonded to the respective lands 3g of the wiring board 3. More specifically, the lower surface 3b of the wiring board 3B is covered by insulating film (solder resist film) SR. Openings are made in the insulating film SR and in each opening, at least a portion of each of the lands 3g is exposed from the insulating film SR. Solder balls SB are bonded to the exposed portions of the lands 3g.

As shown in FIG. 4, the solder balls (external terminals, electrodes, external electrodes) SB to be bonded to the lands 3g on the lower surface 3b of the wiring board 3 are arranged in a matrix pattern (array pattern, matrix pattern). Specifically, the lands 3g and solder balls SB are arranged in rows along each side of the lower surface 3b of the wiring board 3. A semiconductor device in which a plurality of external terminals (solder balls SB, lands 3g) are arranged in a matrix pattern on the mounting surface of the wiring board 3 as mentioned above is called an area array semiconductor device. The area array semiconductor device is advantageous in that the mounting surface (lower surface 3b) of the wiring board 3 can be effectively used as space for external terminals and it is possible to prevent an increase in the element mounting area of the semiconductor device even when the number of external terminals is increased. In other words, in this type of semiconductor device, an increasing number of external terminals can be mounted in a space-saving manner to cope with the trend toward higher functionality and higher integration.

The mounting board MB1 over which the semiconductor device SP1 is mounted as shown in FIG. 3 has an upper surface (surface, semiconductor device mounting surface) Ma as a surface bearing the semiconductor device SP1 and a lower surface (surface, back surface) Mb opposite to the upper surface Ma. The mounting board MB1 is a board on which a plurality of electronic components including the semiconductor device SP1 and capacitor CP1 are mounted and electrically connected, to form a module, and it should be sturdy enough to support the electronic components. For this reason, the thickness of the mounting board MB1 is larger (thicker) than the thickness of the wiring board 3 of the semiconductor device SP1. In the example shown in FIG. 3, the thickness of the mounting board MB1 is approximately 4 mm to 5 mm. The thickness of the mounting board MB1 refers to the distance from one of the upper surface Ma and the lower surface Mb to the other surface. The thickness of the wiring board 3 refers to the distance from one of the upper surface 3a and the lower surface 3b to the other surface. Insulating material NC1 as the base material of the mounting board MB1 is, for example, a prepreg material such as glass fabric impregnated with epoxy resin.

A plurality of electrodes Mp1 are formed on the upper surface Ma of the mounting board MB1. The electrodes Mp1 are interface terminals of the mounting board MB1 to connect the solder balls SB as external terminals of the semiconductor device SP1 as shown in FIG. 3. Therefore, the arrangement of the electrodes Mp1 corresponds to the arrangement of the solder balls SB as shown in FIG. 4. In other words, in this embodiment, the electrodes Mp1 are arranged in a matrix pattern (array pattern, matrix pattern) in plan view as shown in FIG. 5. Specifically, an insulating film (solder resist film) SR lies over the upper surface Ma of the mounting board MB1 to cover the upper surface Ma. Opening are made in the insulating film SR and in each opening, at least a portion of each of the electrodes Mp1 is exposed from the insulating film. In the electronic device ED1, the mounting board MB1 and the semiconductor device SP1 are electrically connected by connecting a solder ball SB with the exposed portion of each of the electrodes Mp1 in the openings of the insulating film SR.

In addition, a plurality of electrodes Mp2 are formed on the lower surface Mb of the mounting board MB1. The electrodes Mp2 are interface terminals of the mounting board MB1 to connect the electronic components including the capacitor CP1 with the mounting board MB1 electrically. As shown in FIG. 3, the electrodes Mp2 are electrically connected with the electrodes Mp1 on the upper surface Ma via through-hole wirings THm formed in the mounting board MB1, respectively.

The through-hole wirings THm are wirings which electrically connect the upper surface Ma and lower surface Mb of the mounting board MB1. A plurality of through holes (holes) TH1, TH2, and TH3 extending from one of the upper surface Ma and the lower surface Mb to the other surface are formed in the mounting board MB1. In each of the through holes TH1, TH2, and TH3, a through-hole wiring THm is formed by embedding a metal film along the wall surface of the through hole (TH1, TH2, or TH3). Further details of the through-hole wirings will be described later.

As shown in FIG. 3, the capacitor CP1 including a power supply voltage terminal ERd and a reference voltage terminal ERs is mounted on the lower surface Mb of the mounting board MB1. The capacitor CP1 is a so-called bypass capacitor which is connected between a power supply voltage supply path and a reference voltage supply path in order to suppress voltage fluctuations of the DC power supplied to the circuitry of the semiconductor device SP1. Thus, the capacitor CP1 is electrically connected with the semiconductor device SP1 via the electrodes Mp1 and Mp2 of the mounting board MB1 and the through-hole wirings THm. More specifically, the power supply voltage terminal ERd of the capacitor CP1 is electrically connected with the power supply voltage electrode Pd2 among the electrodes Mp2 of the mounting board MB 1 via a solder member (not shown). Also, the reference voltage terminal ERs of the capacitor CP1 is electrically connected with the reference voltage electrode Ps2 among the electrodes Mp2 of the mounting board MB 1 via a solder member.

The solder members for connecting the pads 2*pd* and bonding fingers 3*f* and the solder balls SB shown in FIG. 3 are made of so-called lead-free solder which is virtually free of lead (Pb). For example, the material is tin (Sn) or tin-bismuth (Sn—Bi) or tin-silver-copper (Sn—Ag—Cu). Lead-free solder here means solder which contains not more than 0.1 wt % lead (Pb), in accordance with the RoHs (Restriction of Hazardous Substances) Directive. Hereinafter, when reference is made to solder, it means lead-free solder unless otherwise specified.

<Path for Coupling Between the Bypass Capacitor and Semiconductor Device>

Figure 6:
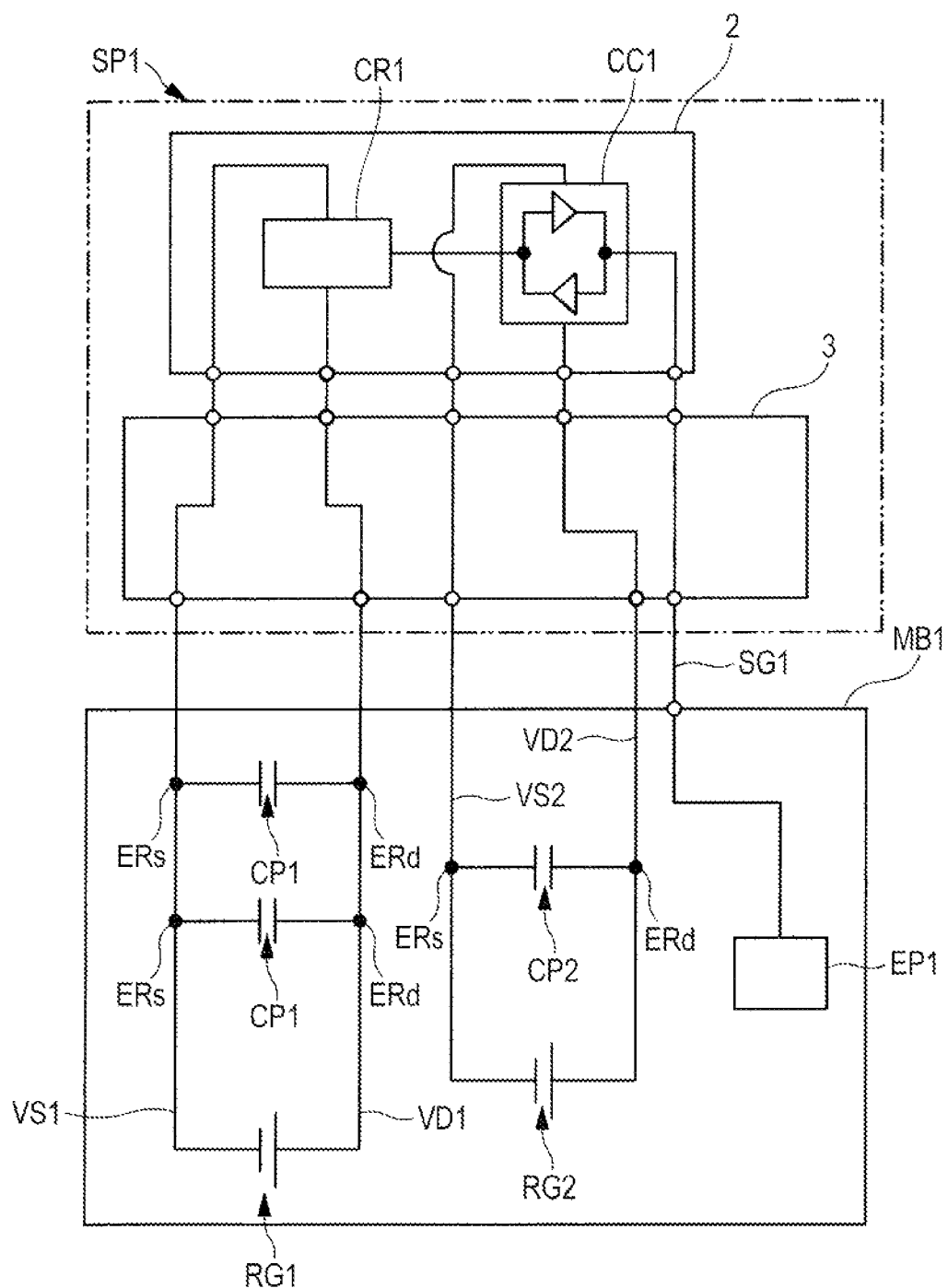
FIG. 6 is a circuit block diagram showing the electrical connecting relation among the electronic components of the electronic device shown in FIG. 3.
Figure 7:
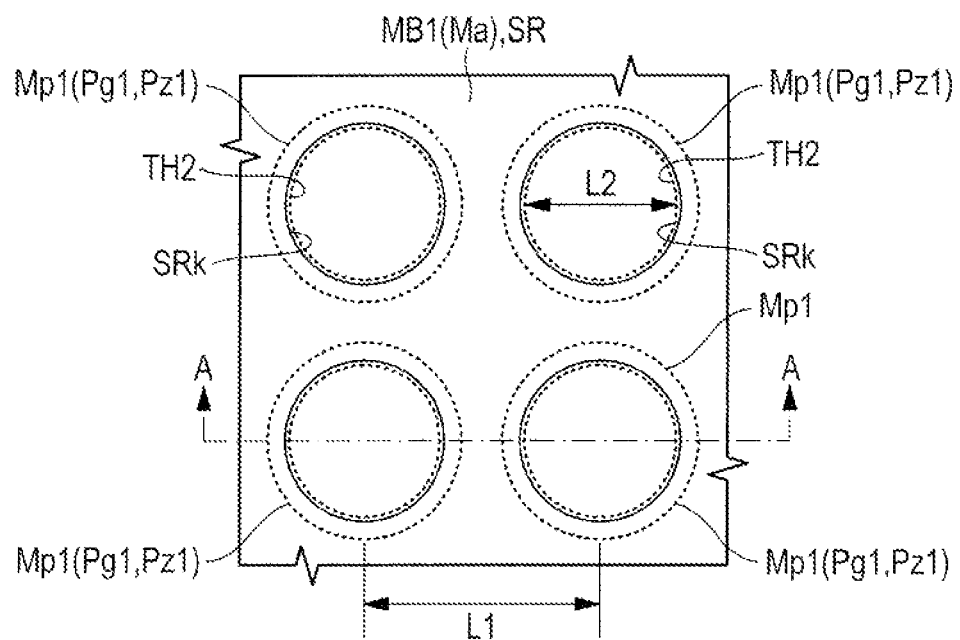
FIG. 7 is an enlarged plan view of part B of FIG. 5.
Figure 8:
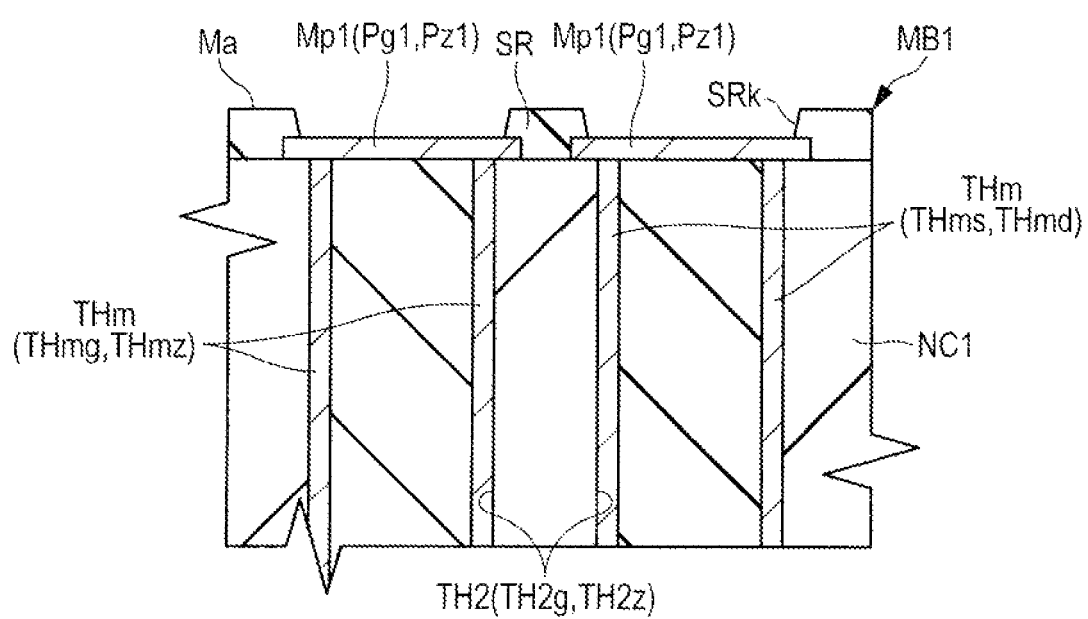
FIG. 8 is an enlarged sectional view taken along the line A-A of FIG. 7.
Figure 9:
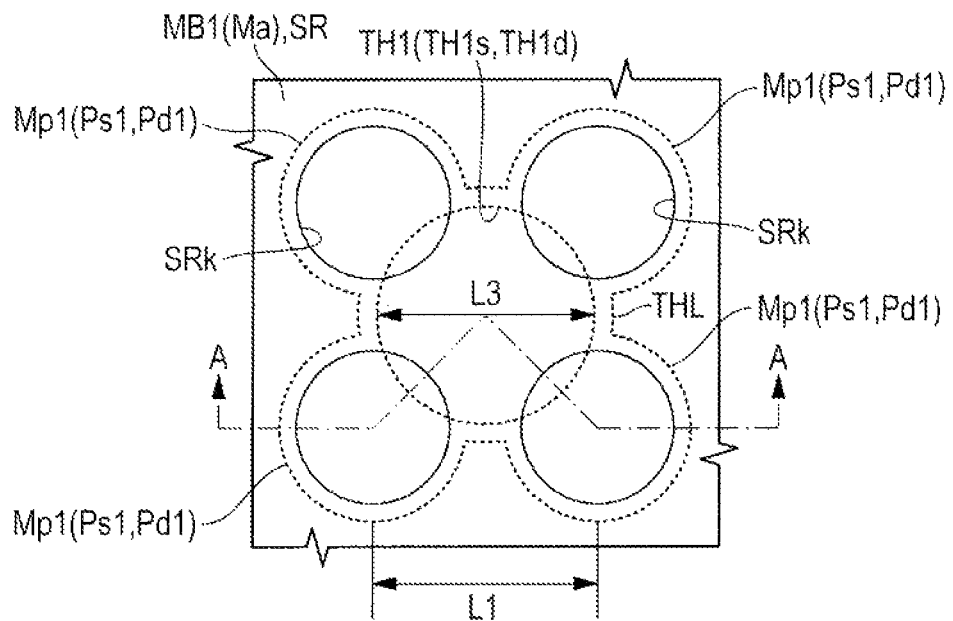
FIG. 9 is an enlarged plan view of part C of FIG. 5.
Figure 10:
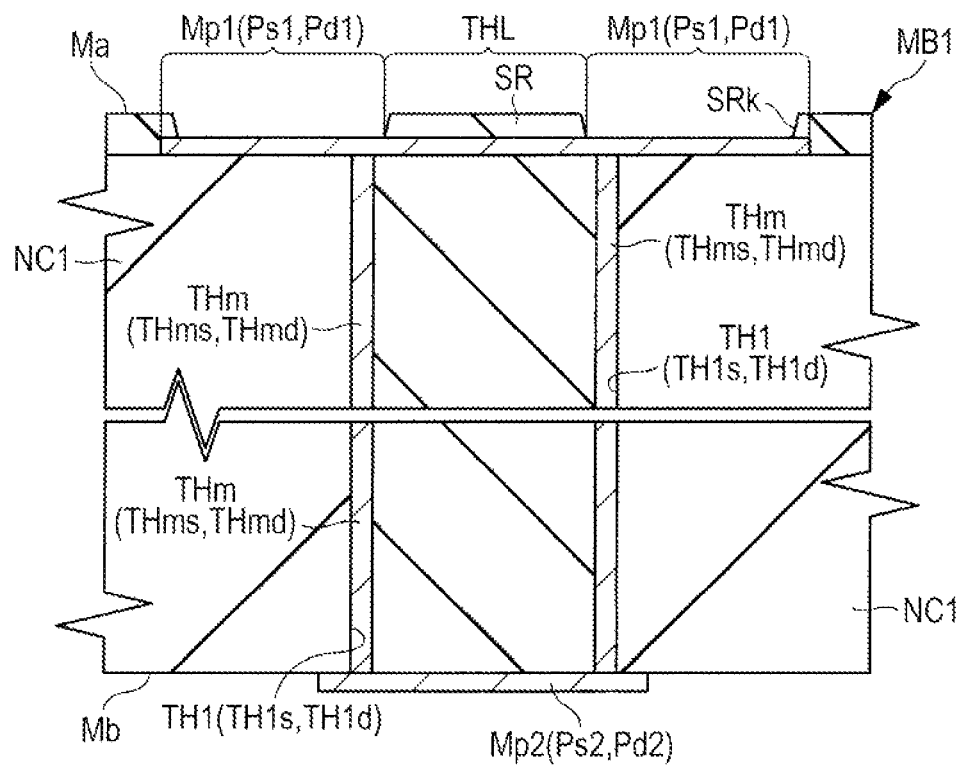
FIG. 10 is an enlarged sectional view taken along the line A-A of FIG. 9.

Next, the path for connecting between the capacitor CP1 and semiconductor device SP1 shown in FIG. 3 will be described in detail. FIG. 6 is a circuit block diagram showing the electric connecting relation among the electronic components of the electronic device shown in FIG. 3. FIG. 7 is an enlarged plan view of part B of FIG. 5, FIG. 8 is an enlarged sectional view taken along the line A-A of FIG. 7, FIG. 9 is an enlarged plan view of part C of FIG. 5, and FIG. 10 is an enlarged sectional view taken along the line A-A of FIG. 9. Although the semiconductor chip 2 shown in FIG. 3 includes not only the circuits shown in FIG. 6 but also other circuits, FIG. 6 shows some of the circuits of the semiconductor chip 2 as typical circuits. In FIGS. 7 and 9, the outlines of the metal patterns of the electrodes Mp1 and through-hole lands THL (FIG. 9) and the outlines of the through holes TH1 and TH2 in plan view are indicated by dotted lines. FIGS. 9 and 10 show an area in which several power supply voltage electrodes Pd1 among the electrodes Mp1 shown in FIG. 5 are arranged is shown as a typical example. Since the areas in which the reference voltage electrodes Ps1 shown in FIG. 5 are arranged are structurally the same as the area shown in FIGS. 9 and 10, signs Ps1 of the reference voltage electrodes Ps1 are also added in FIGS. 9 and 10.

As shown in FIG. 6, the semiconductor chip 2 includes a core circuit CR1 and an input/output circuit CC1. The input/output circuit CC1 has a function to send an input electric signal from outside the semiconductor chip 2 to the core circuit CR1 and send an output electric signal from the core circuit CR1 to outside the semiconductor chip 2. The core circuit CR1 is an active circuit other than the input/output circuit; for example, it is an arithmetic processing circuit, control circuit, memory circuit, electric conversion circuit, drive circuit, or sensor circuit. FIG. 6 shows an example that a single signal line SG1 as an electric signal transmission path is connected with the input/output circuit CC1. However, the number of signal lines SG1 is not limited to one and in some cases, more than one signal line SG1 are connected with it.

Power supply lines are connected with the core circuit CR1 and input/output circuit CC1 to supply drive voltage for the respective circuits. Specifically, a power supply voltage line VD1 to supply power supply voltage for the core circuit from a power supply RG1 and a reference voltage line VS1 to supply reference voltage for the core circuit from the power supply RG1 are connected with the core circuit CR1. Also, a power supply voltage line VD2 to supply power supply voltage for the input/output circuit from a power supply RG2 and a reference voltage line VS2 to supply reference voltage for the input/output circuit from the power supply RG2 are connected with the input/output circuit CC1.

A capacitor CP1 is connected in parallel to the power supply RG1 between the core circuit CR1 and power supply RG1. The capacitor CP1 has a power supply voltage terminal ERd and a reference voltage terminal ERs. The power supply voltage terminal ERd of the capacitor CP1 is connected with the power supply voltage line VD1 and the reference voltage terminal ERs is connected with the reference voltage line VS1. In short, the capacitor CP1 is a bypass capacitor which is connected between the power supply voltage line VD1 and reference voltage line VS1 in order to suppress voltage fluctuations of the DC power supplied to the core circuit CR1. In this embodiment, more than one capacitor CP1 (two capacitors in the example shown in FIG. 6) are connected between the core circuit CR1 and power supply RG1 as shown in FIG. 6. The number of capacitors CP1 may be varied according to the required electrical characteristics for the bypass capacitor as necessary.

A capacitor CP2 is connected in parallel to the power supply RG2 between the input/output circuit CC1 and power supply RG2. The capacitor CP2 has a power supply voltage terminal ERd and a reference voltage terminal ERs. The power supply voltage terminal ERd of the capacitor CP2 is connected with the power supply voltage line VD2 and the reference voltage terminal ERs is connected with the reference voltage line VS2. In short, the capacitor CP2 is a bypass capacitor which is connected between the power supply voltage line VD2 and reference voltage line VS2 in order to suppress voltage fluctuations of the DC power supplied to the input/output circuit CC1.

Since a bypass capacitor is a capacitive element to suppress voltage fluctuations of DC power, it is desirable to shorten the power supply circuit distance from a power-consuming circuit (core circuit CR1 or input/output circuit CC1 in the example shown in FIG. 6) to the bypass capacitor. When the distance between the bypass capacitor and the power-consuming circuit is larger, the resistance component in the path is larger. Also, when the distance between the bypass capacitor and the power-consuming circuit is larger, the inductance component in the path is larger. Particularly in the core circuit CR1, the influence of voltage fluctuations which cause characteristic degradation is larger than in the input/output circuit CC1.

In an area array semiconductor device SP1 in which external terminals are arranged in a matrix pattern as in this embodiment, many external terminals are densely arranged. Therefore, it is difficult to provide space for a bypass capacitor on the upper surface Ma of the mounting board MB1 as a semiconductor package mounting surface. When the semiconductor chip 2 provides higher functionality, it may include many more core circuits of different types and require a larger number of bypass capacitors, so the arrangement of bypass capacitors is more restricted. For this reason, in this embodiment, the capacitors CP1 and CP2 as bypass capacitors are arranged on the lower surface Mb of the mounting board MB1 as shown in FIGS. 2 and 3.

It is particularly desirable that as shown in FIG. 3, the semiconductor device SP1 and capacitor CP1 be mounted in a way to overlap each other in the thickness direction of the mounting board MB1 (Z direction in FIG. 3) because the path distance (path length) between the capacitor CP1 as a bypass capacitor and the core circuit CR1 (FIG. 6) is decreased.

In the example shown in FIG. 3, the capacitor CP2 is arranged in a way not to overlap the semiconductor device SP1 in the thickness direction of the mounting board MB1. In this case, in order to obtain the space for the capacitors CP1 on the lower surface Mb of the mounting board MB1, the capacitor CP2, the priority of which is relatively low, is arranged in a way not to overlap the semiconductor device SP1. Alternatively, it is also possible that the capacitor CP2 as well as the capacitors CP1 is arranged in a way to overlap the semiconductor device SP1 in the thickness direction of the mounting board MB1.

However, the present inventors found the following problem. The mounting board MB1 must be sturdy enough to support various electronic components including the semiconductor device SP1 and capacitors CP1, so it is difficult to perform micro-fabrication to cope with reduction in the size of the semiconductor device SP1.

In order to meet the demand for compact and highly functional semiconductor packages, many external terminals must be arranged densely (in other words, with a small pitch). FIG. 4 shows an example that the distance between the centers of adjacent solder balls SB (distance L1 shown in FIG. 7) among the solder balls SB arranged in a matrix pattern is designed to be 0.4 mm. Since a solder ball SB is bonded to each of the electrodes Mp1 of the mounting board MB1 as shown in FIG. 3, the distance between the centers of adjacent electrodes Mp1 among the electrodes Mp1 shown in FIG. 5 is also designed to be 0.4 mm.

When many external terminals are arranged with a small pitch as mentioned above, the diameter of the through holes (opening diameter) to form through-hole wirings THm (FIG. 3) for electrical connecting between the upper surface Ma and lower surface Mb of the mounting board must be small enough to prevent shorting between adjacent external terminals. For example, as shown in FIGS. 7 and 8, the diameter L2 (FIG. 7) of the through holes TH2 connected with the electrodes Mp1, respectively, is approximately 0.27 μm.

The through holes TH2 with a diameter of 0.27 μm are made, for example, using a drill (not shown). However, since the thickness of the mounting board MB1 is larger than the wiring board 3 shown in FIG. 3 as mentioned above, it is difficult to make small-diameter holes penetrating the mounting board MB1 in the thickness direction stably. Another reason that it is difficult to make small-diameter holes penetrating the mounting board MB1 in the thickness direction stably is that the insulating material NC1 as the base material of the mounting board MB1 is a hard material such as prepreg.

Therefore, as shown in FIG. 3, the through holes TH2 with a relatively small diameter terminate midway between the upper surface Ma and lower surface Mb without penetrating the mounting board MB1 from the upper surface Ma to the lower surface Mb. Each electrode Mp1 connected with a through hole TH2 is electrically connected with an electrode Mp2 on the lower surface Mb via a detour wiring CW1 formed between the upper surface Ma and lower surface Mb. More specifically, as shown in FIG. 3, a through hole TH3 with a larger diameter than the through hole TH2 is formed in a way not to overlap the semiconductor device SP1 in the thickness direction of the mounting board MB1. The diameter of the through hole TH3 is larger than the diameter of the through hole TH2 and for example, 0.35 to 0.42 mm. Since the through hole TH3 can be made to penetrate the mounting board MB1 in the thickness direction because its diameter is relatively large, it can be connected with an electrode Mp2 on the lower surface Mb of the mounting board MB1. The detour wiring CW1 is connected with the through-hole wiring THm formed along the wall surface of the through hole TH3 and the through-hole wiring THm formed along the wall surface of the through hole TH2. In other words, the electrode Mp1 connected with the through hole TH2 is electrically connected with the electrode Mp2 via the detour wiring CW1 and the through-hole wiring THm formed in the through hole TH3.

As mentioned earlier, it is desirable to shorten the path distance from the bypass capacitor to the circuit which consumes power. Therefore, when the upper surface Ma and lower surface Mb of the mounting board MB1 are connected via the detour wiring CW1 as shown in FIG. 3, the path distance is longer than when they are connected without the mediation of the detour wiring CW1. As a result, the impedance component of the voltage supply path becomes larger and the voltage fluctuation suppression effect becomes smaller. In addition, when the distance of the power supply path connected with the bypass capacitor is larger, the inductance in the path is larger and particularly in a high frequency circuit, the margin to avoid the influence of anti-resonance is smaller. Here "inductance" refers to self-inductance.

Therefore, the present inventors researched into technology to connect an electrode Mp1 on the upper surface Ma and an electrode Mp2 on the lower surface Mb via a through hole TH1 penetrating the mounting board MB1 in the thickness direction for the voltage supply path to the core circuit CR1 (FIG. 6) in which the influence of voltage fluctuations may cause serious characteristic degradation.

In this embodiment, among the electrodes Mp1 shown in FIG. 5, the power supply voltage electrodes Pd1 to supply power supply voltage to the core circuit CR1 (FIG. 6) and the reference voltage electrodes Ps1 to supply reference voltage to the core circuit CR1 are connected with the through-hole wirings THm formed inside of the through holes TH1 with a larger diameter than the through holes TH2.

The diameter of the through holes TH1 can be large since space equivalent to several electrodes Mp1 in plan view is available. In the example shown in FIG. 9, the diameter L3 of a through hole TH1 is larger than the diameter L2 of the through hole TH2 shown in FIG. 7 and it is, for example, 0.35 to 0.42 mm. Since the diameter L3 of the through holes TH1 is relatively large, they can be stably formed in a way to penetrate the mounting board MB1 in the thickness direction, for example, using a technique of making through holes with a drill. Consequently, the electrodes Mp2 connected with the capacitor CP1 as a bypass capacitor can be connected with the electrodes Mp1 connected with the semiconductor device SP1 without the mediation of the detour wiring CW1 as shown in FIG. 3. Next, details of this embodiment will be described.

Among the electrodes Mp1 shown in FIG. 5, the power supply voltage electrodes Pd1 to supply power supply voltage to the core circuit CR1 (FIG. 6) are adjacent to each other. Also, among the electrodes Mp1, the reference voltage electrodes Ps1 to supply reference voltage to the core circuit CR1 are adjacent to each other. In other words, in this embodiment, a plurality of terminals for supplying voltage to the core circuit CR1 are provided and these terminals are arranged in a concentrated manner. As mentioned above, it is desirable to reduce the impedance component of the voltage supply path for connecting between the core circuit CR1 and bypass capacitor. From the viewpoint of reduction of the impedance component of the voltage supply path, it is desirable to provide a plurality of terminals to supply voltage to the core circuit CR1 as in this embodiment.

As shown in FIG. 10, a through hole TH1$d$ as a power supply voltage hole overlaps part of each of the several power supply voltage electrodes Pd1 and a power supply voltage electrode Pd2 in the thickness direction of the mounting board MB1. A through-hole wiring (power supply voltage wiring) THmd formed inside the through hole (power supply voltage hole) TH1$d$ is cylindrically shaped along the wall of the through hole TH1. Therefore, the several power supply voltage electrodes Pd1 are mutually connected via the through-hole wiring THmd formed inside the through hole TH1$d$. Thus, the several power supply voltage electrodes Pd1 are electrically connected with the power supply voltage electrodes Pd2 via the power supply voltage through-hole wiring THmd formed inside the through hole TH1$d$.

Furthermore, as shown in FIG. 10, a through hole TH1$s$ as a reference voltage hole overlaps part of each of the several reference voltage electrodes Pd1 and a reference voltage electrode Ps2 in the thickness direction of the mounting board MB1. A through-hole wiring (reference voltage wiring) THms formed inside the through hole (reference voltage hole) TH1$s$ is cylindrically shaped along the wall of the through hole TH1. Therefore, the reference voltage electrodes Ps1 are mutually connected via the through-hole wiring THms formed inside the through hole TH1$s$. Thus, the several reference voltage electrodes Ps1 are electrically connected with the reference voltage electrodes Ps2 via the reference voltage through-hole wiring THms formed inside the through hole TH1$s$.

One possible approach is that all the electrodes Mp1 on the upper surface Ma of the mounting board MB1 are structurally the same as the several power supply voltage electrodes Pd1 or reference voltage electrodes Ps1 shown in FIG. 9. If that is the case, all the through holes in the mounting board MB1 would be made to have the same dimensions as the through holes TH1. However, some of the electrodes Mp1 need not be connected with the through holes TH1 or through holes TH3 which penetrate the mounting board MB1. For this reason, in this embodiment, some of the electrodes Mp1 have the structure shown in FIGS. 9 and 10 and the others have the structure shown in FIGS. 7 and 8.

As shown in FIG. 6, the signal line SG1 as an electric signal transmission path is not connected with a bypass capacitor. Therefore, among the electrodes Mp1 shown in FIG. 5, the signal electrodes Pg1 used for signal transmission have the structure shown in FIGS. 7 and 8. Specifically, the signal electrodes Pg1 are connected with the through holes (signal holes) TH2$g$ as shown in FIGS. 7 and 8, respectively. The signal electrodes Pg1 are electrically connected with the through-hole wirings (signal wirings) THmg formed inside the through holes TH2$g$, respectively. Since each through hole TH2 does not penetrate the mounting board MB1 but extends from the upper surface Ma to midway between the upper surface Ma and lower surface Mb as shown in FIG. 3, its diameter L2 (FIG. 7) can be smaller than the diameter L3 of the through hole TH1 (FIG. 9). Therefore, even when several signal electrodes Pg1 are arranged adjacently to each other, adjacent signal electrodes Pg1 can be electrically isolated from each other. The electrically isolated signal electrodes Pg1 are electrically connected with the through-hole wirings THmg, respectively. In other words, the signal electrodes Pg1 can be used as transmission paths for different electric signals, leading to an increase in the arrangement density of interface terminals. As a result, the semiconductor device SP1 can be smaller in size.

The input/output circuit drive electrodes Pz1 shown in FIGS. 5, 7, and 8 are each a pair comprised of a power supply voltage electrode to supply power supply voltage to the input/output circuit CC1 (FIG. 6) and a reference voltage electrode to supply reference voltage to the input/output circuit CC1. As mentioned above, the circuit which supplies drive voltage to the input/output circuit CC1 shown in FIG. 6 is connected with the capacitor CP2 as a bypass capacitor. However, in the input/output circuit CC1, the influence of voltage fluctuations which cause characteristic degradation is smaller than in the core circuit CR1.

For this reason, in this embodiment, among the electrodes Mp1 shown in FIG. 5, the several input/output circuit drive electrodes Pz1 used to supply drive voltage to the input/output circuit CC1 (FIG. 6) have the structure as shown in FIGS. 7 and 8. In other words, the input/output circuit drive electrodes Pz1 are connected with the through holes (input/output circuit drive holes) TH2$z$ as shown in FIGS. 7 and 8, respectively. Also the input/output circuit drive electrodes Pz1 are electrically connected with the through-hole wirings (input/output circuit drive wirings) THmz formed inside the through holes TH2$z$, respectively. Since the diameter L2 of the through holes TH2$z$ is smaller than the diameter L3 of the through holes TH1 shown in FIG. 9, adjacent input/output circuit drive electrodes Pz1 can be electrically isolated from each other. The electrically isolated input/output circuit drive electrodes Pz1 are electrically connected with the through-hole wirings THmz, respectively. In other words, the input/output circuit drive electrodes Pz1 can be used as transmission paths for different electric signals, leading to an increase in the arrangement density of interface terminals. As a result, the semiconductor device SP1 can be smaller in size.

However, the circuit which supplies drive voltage to the input/output circuit CC1 is connected with the capacitor CP2 as a bypass capacitor. Therefore, if there is concern over characteristic degradation of the semiconductor device SP1 due to fluctuations in the input/output circuit drive voltage, the input/output circuit drive electrodes Pz1 may each have the structure described referring to FIGS. 9 and 10.

As shown in FIG. 2, the area of each of the electrodes Mp2 shown in FIG. 2 on the lower surface Mb of the mounting board MB1 is larger than the area of each of the electrodes Mp1 shown in FIG. 5. In this embodiment, the electrodes Mp2 shown in FIG. 2 and the electrodes Mp1 shown in FIG. 5 each have a circular planar shape and the diameter of the electrodes Mp2 is larger than the diameter of the electrodes Mp1. When several electrodes Mp1 are united like the power supply voltage electrodes Pd1 or reference voltage electrodes Ps1 shown in FIG. 9, the entire conductor pattern area of the united electrodes is larger than the area of the electrode Mp2 shown in FIG. 2.

The distance L4 between the centers of a power supply voltage electrode Pd2 and a reference voltage electrode Ps2 which are paired as shown in FIG. 2 and connected with a capacitor CP1 is larger than the distance L1 between the centers of adjacent electrodes Mp1 shown in FIG. 7. In the example shown in FIG. 2, the distance L4 is approximately 1.0 to 1.2 mm.

As explained above, the mounting board MB1 in this embodiment has through holes TH1 penetrating the mounting board MB1 in the thickness direction and through holes TH2 extending from the upper surface Ma to midway between the upper surface Ma and lower surface Mb without penetrating the mounting board MB1. Therefore, even though the electrodes Mp1 are arranged with a small pitch on the upper surface Ma, the pitch with which the electrodes Mp2 are arranged on the lower surface Mb can be freely designed depending on the shape of the capacitor CP1. In other words, it is possible to arrange the electrodes Mp2 depending on the size of the capacitor CP1 instead of determining the size of the capacitor CP1 depending on the pitch with which the electrodes Mp2 are arranged. Consequently, the freedom in selection of the capacitor CP1 in the design stage is increased.

The through holes TH2 shown in FIG. 7 are arranged just under the respective electrodes Mp1. On the other hand, the through hole TH1 shown in FIG. 9 is arranged across several electrodes Mp1. Therefore, the distance between the center of the through hole TH2 and the center of the through hole TH1 is larger than the distance between the centers of adjacent through holes TH2. In other words, the arrangement pitch (distance between centers) between a signal through hole TH2$g$ (FIG. 7) and a power supply voltage or reference voltage through hole TH1$d$ or TH1$s$ (FIG. 9) is larger than the arrangement pitch (distance between centers) between adjacent signal through holes TH2$g$. Since a through hole TH1 is connected with several electrodes Mp1, it may be arranged in a desired place across the several electrodes Mp1. As a result, the distance between the center of a power supply voltage through hole TH1$d$ and the center of a reference voltage through hole TH1$s$ can be adjusted according to the arrangement pitch of electrodes Mp2 shown in FIG. 2.

As shown in FIG. 9, several adjacent power supply voltage electrodes Pd1 (several adjacent reference voltage electrodes Ps1) are connected via a through-hole land (conductor) THL. The through-hole land THL is a conductor pattern made of the same materials as the electrodes Mp1 so as to cover the through hole TH1.

It is possible to connect several electrodes Mp1 via a through-hole wiring THm as shown in FIG. 10 without a through-hole land THL as shown in FIGS. 9 and 10. However, the presence of a conductor pattern across several electrodes Mp1 contributes to stabilization of electrical characteristics. Thus, from the viewpoint of stabilizing the characteristics of the path to supply voltage to drive the core circuit CR1 shown in FIG. 6, it is desirable to connect several power supply voltage electrodes Pd1 (several reference voltage electrodes Ps1) via a through-hole land.

As shown in FIGS. 8 and 10, the through-hole wirings THm are cylindrically shaped inside the through holes TH1 and TH2, for example, using a plating technique. In order to protect the metal film formed by a plating technique, an insulating material such as resin is embedded in each cylindrical through-hole wiring THm. The inductance of a through-hole wiring THm is smaller when an insulating material is embedded in the through-hole wiring THm extending along the inside of the through hole TH1 than when conductor is embedded in the entire through hole TH1 to form the through-hole wiring THm. Therefore, for a high frequency circuit in particular, in order to increase the margin to avoid the influence of anti-resonance, it is desirable to have an insulating material embedded in the through-hole wiring THm.

As shown in FIG. 2, in this embodiment, the capacitor CP1 is arranged in an area in which it overlaps the semiconductor chip 2 in the thickness direction. In other words, among the electrodes Mp2 on the lower surface Mb of the mounting board MB1, the power supply voltage electrode Pd2 and reference voltage electrode Ps2 connected with a capacitor CP1 are arranged in a way to overlap the semiconductor chip 2 in the thickness direction. Therefore, as shown in FIG. 5, among the electrodes Mp1 on the upper surface Ma of the mounting board MB1, the power supply voltage electrodes Pd1 and reference voltage electrodes Ps1 which supply power supply voltage and reference voltage to the core circuit CR1 (FIG. 6), respectively, are arranged in a way to overlap the semiconductor chip 2 in the thickness direction.

Though not shown, as a variation of this embodiment, the capacitor CP1 shown in FIG. 3 and the power supply voltage electrodes Pd1 and Pd2 and reference voltage electrodes Ps1 and Ps2 may be arranged in a way not to overlap the semiconductor chip 2 in the thickness direction. However, from the viewpoint of shortening the transmission distance between the capacitor CP1 and core circuit CR1 (FIG. 6), it is desirable that the capacitor CP1, power supply voltage electrodes Pd1 and Pd2 and reference voltage electrodes Ps1 and Ps2 be arranged in a way to overlap the semiconductor chip 2 in the thickness direction.

On the other hand, among the electrodes Mp1 shown in FIG. 5, at least some of the signal electrodes Pg1 are arranged in a way not to overlap the semiconductor chip 2 in the thickness direction. Since some signal electrodes Pg1 are arranged in a way not to overlap the semiconductor chip 2 in the thickness direction, more space is available for power supply voltage electrodes Pd1 and reference voltage electrodes Ps1 in the area which overlaps the semiconductor chip 2.

Method of Manufacturing an Electronic Device

Figure 11:
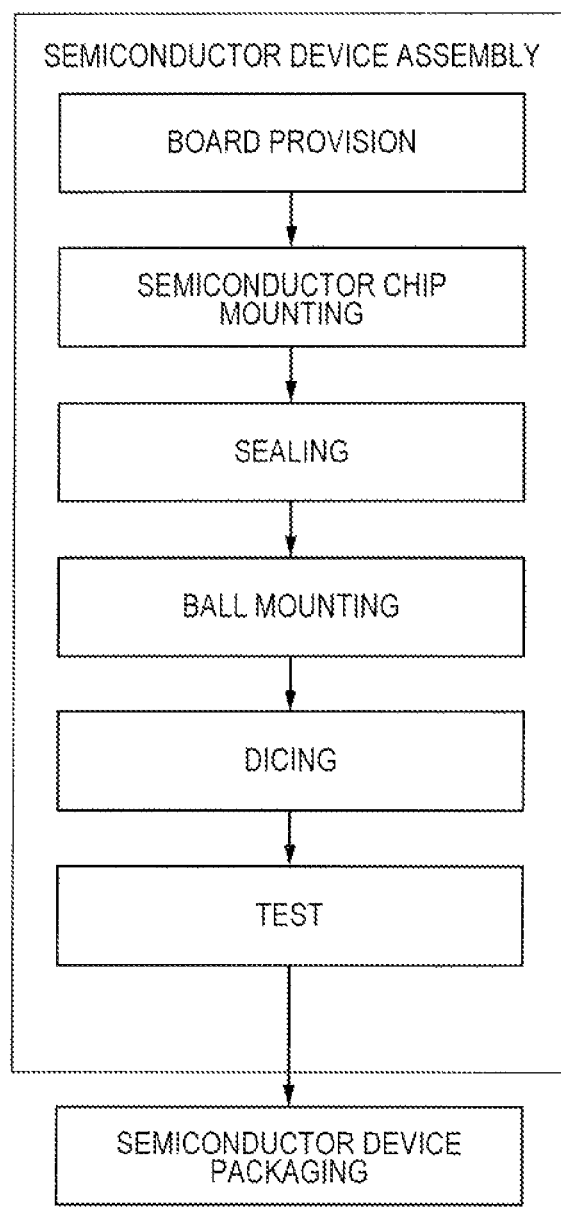
FIG. 11 is a flowchart illustrating the process of manufacturing the electronic device shown in FIG. 1.

Next, the method of manufacturing the electronic device described referring to FIGS. 1 to 10, namely the method of packaging the semiconductor device SP1 shown in FIG. 3 will be described. The electronic device ED1 shown in FIGS. 1 to 3 is manufactured in accordance with the flowchart of FIG. 11. As shown in FIG. 11, the method of manufacturing an electronic device according to this embodiment includes a process of assembling a semiconductor device (semiconductor device assembly process) and a process of mounting a finished semiconductor device over a mounting board (semiconductor device mounting process). The semiconductor device assembly process includes a test step in which an assembled semiconductor device is inspected (semiconductor device inspection step). Alternatively the semiconductor device (test object) assembly steps before the test step may be called the semiconductor device assembly process. Next, an explanation will be given of the method on the assumption that the assembly process includes the test step.

Method of Manufacturing a Semiconductor Device (Semiconductor Device Assembly Process)

Figure 12:
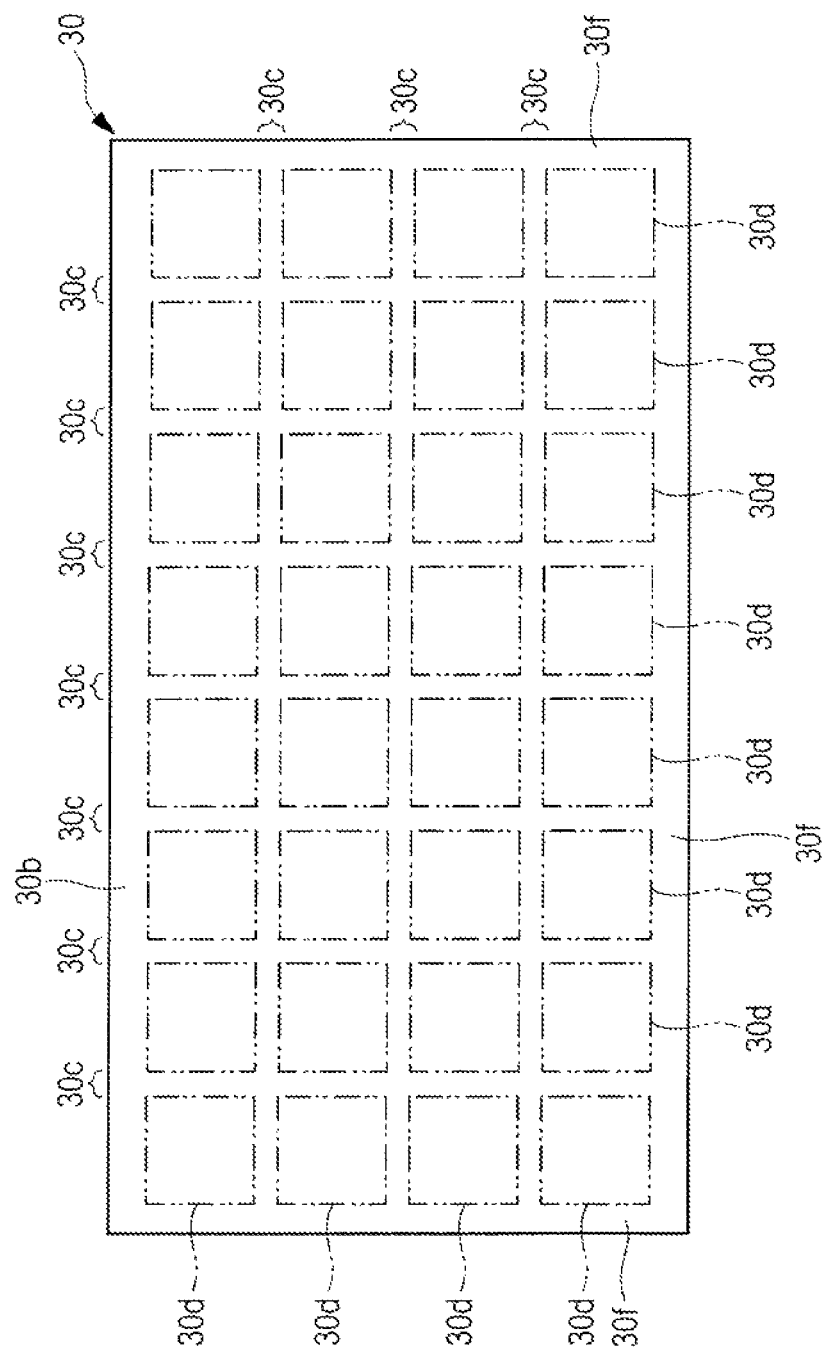
FIG. 12 is a plan view showing the general structure of a wiring board provided in the board provision step shown in FIG. 11.

In the semiconductor device assembly process, a semiconductor device SP1 to be mounted over the mounting board MB1 shown in FIG. 3 is assembled. In the method explained below, a so-called multi-device board having a plurality of device regions each equivalent to the wiring board 3 shown in FIG. 3 is provided and assembling is carried out in each of the device regions. Each of the device regions 30d shown in FIG. 12 is equivalent to the wiring board 3 described above referring to FIGS. 1, 3, 4, and 6. The explanation below is given in reference to FIGS. 1 to 10 as necessary.

1. Board Provision Step

First, in the board provision step (FIG. 11), for example, a wiring board 30 shown in FIG. 12 is provided. FIG. 12 is a plan view showing the general structure of the wiring board provided in the board provision step (FIG. 11). As shown in FIG. 12, the wiring board 30 provided in this step has a plurality of device regions 30d arranged in a matrix pattern inside a frame (outer frame) 30f. The device regions 30d each is equivalent to the wiring board 3 shown in FIG. 3. The wiring board 30 is what is called a multi-device board having a plurality of device regions 30d and cutting lines (cutting regions) between device regions 30c. The use of a multi-device board having a plurality of device regions 30d like this improves manufacturing efficiency.

On the wiring board 30 provided in this step, the constituent members described above referring to FIGS. 1, 3, 4, and 6 are formed in advance, although the semiconductor chip 2 shown in FIG. 3 is not mounted yet, the solder balls SB are not connected yet, and the resin 4 is not formed yet. Therefore, descriptions of these constituent members are not repeated.

2. Chip Mounting Step

Next, in the chip mounting step (FIG. 11), the semiconductor chip 2 is mounted over the upper surface 3a as the chip mounting surface of the wiring board 30 (FIG. 12) as shown in FIG. 3. The semiconductor elements of the semiconductor chip 2 are electrically connected with a plurality of pads (electrodes, electrode pads) 2pd formed on the front surface 2a.

In this step, the semiconductor chip 2 is mounted over each of the device regions 30d (FIG. 12). In this embodiment, the semiconductor chip 2 is mounted over the wiring board 3 by a flip-chip bonding method in which the front surface 2a bearing the pads 2pd is made to face the chip mounting surface (upper surface 3a) as shown in FIG. 3. For this reason, a plurality of bump electrodes 2bp as conductive members for flip-chip bonding are connected with the pads 2pd of the semiconductor chip 2, respectively. In this step, the pads of the semiconductor chip 2 are electrically connected with the bonding fingers 3f of the wiring board 3 via the bump electrodes 2bp.

3. Sealing Step

Next, in the sealing step, the area where the semiconductor chip 2 and wiring board 30 are electrically connected is sealed. In this embodiment, as shown in FIG. 3, the resin 4 is supplied to the gap between the semiconductor chip 2 and wiring board 30 (FIG. 12) to seal the area around the electrical connections (bump electrodes 2bp) of the semiconductor chip 2 and wiring board 30.

4. Ball Mounting Step

Next, in the ball mounting step (FIG. 11), a plurality of solder balls SB are attached to the lower surface 3b of the wiring board 3 as the mounting surface. In this step, the solder balls SB are placed over the lands 3g shown in FIG. 3 and reflow soldering (after heating to melt solder for bonding, cooling is done) is carried out. Consequently the lands 3g and solder balls are bonded.

5. Dicing Step

Next, in the dicing step (FIG. 11), the wiring board 30 is cut along the cutting lines 30c which demarcate the device regions 30d (FIG. 12). Consequently the wiring board 30 as a multi-device board is separated (divided) into device regions 30d as individual pieces to obtain a plurality of semiconductor devices SP1.

6. Test Step

Next, in the test step (semiconductor device inspection step) (FIG. 11), necessary checks and tests such as appearance inspection and electrical testing are carried out. When electrical testing is carried out in the test step, the technique related to the wiring layout of the above mounting board can be applied to a test board. An embodiment which applies the above technique to a test board will be described in detail later as a variation of the above technique.

Semiconductor Device Mounting Process

In the semiconductor device mounting process (FIG. 11), as shown in FIG. 3, the semiconductor device SP1 is mounted over the upper surface Ma of the mounting board MB1 as the semiconductor package mounting surface. The mounting board MB1 provided for this process has already been described referring to FIGS. 1 to 10 and its description is not repeated here.

The mounting board MB1 shown in FIG. 3 is made by bonding two wiring substrates of insulating material NC1 as a base material together via an insulating bonding layer NC2. The through holes TH2 and the through-hole wirings THm in the through holes TH2 are previously made in the wiring substrate having the upper surface Ma, for example, using a drill. On the other hand, the through holes TH1 and TH3 and the through-hole wirings THm in the through holes TH1 and TH3 are made, for example, using a drill with a larger diameter than the drill used to make the through holes TH2 after the two wiring substrates are bonded together.

The capacitors CP1 and capacitor CP2 shown in FIG. 2 may be mounted before or after this semiconductor device mounting process or simultaneously in this process by the reflow soldering step. An example of the semiconductor device mounting process in this embodiment will be given below on the assumption that the capacitors CP1 and capacitor CP2 shown in FIG. 2 are previously mounted on the lower surface Mb of the mounting board before the process.

In this process, as shown in FIG. 3, the solder balls SB are electrically connected with the electrodes Mp1, respectively, with the lower surface 3b as the semiconductor device SP1 mounting surface facing the upper surface Ma of the mounting board MB1. The distance between the centers of solder balls SB shown in FIG. 4 is equal to the distance between the centers of electrodes Mp1 shown in FIG. 5. Therefore, in this process, the positions of the mounting board MB1 and semiconductor device SP1 can be adjusted so that the solder balls SB are placed over the respective electrodes Mp1.

In order to ensure that the solder balls and electrodes Mp1 are bonded together easily, it is desirable to form a solder member on each of the exposed surfaces of the electrodes Mp1. When a solder member is formed on each of the exposed surfaces of the electrodes Mp1, the wettability of the solder balls SB is improved.

With the above steps, the electronic device as mentioned above is completed.

Variations

The invention made by the present inventors has been so far explained concretely in reference to the preferred embodiment thereof. However, the invention is not limited thereto and it is obvious that these details may be modified in various ways without departing from the spirit and scope thereof.

Variation 1

Figure 13:
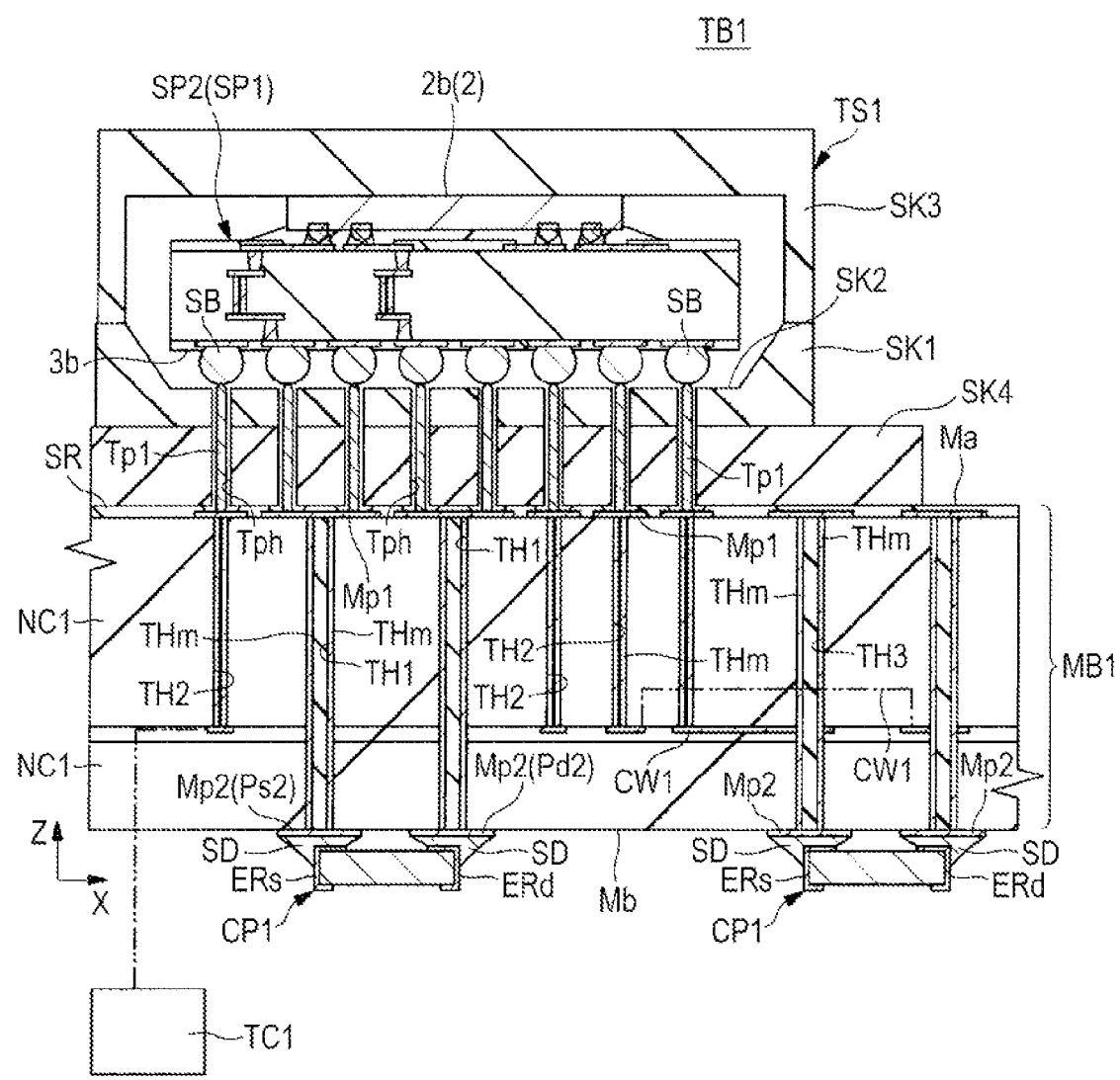
FIG. 13 is an enlarged sectional view of an essential part of a semiconductor device placed in a test device in the test step shown in FIG. 11.
Figure 14:
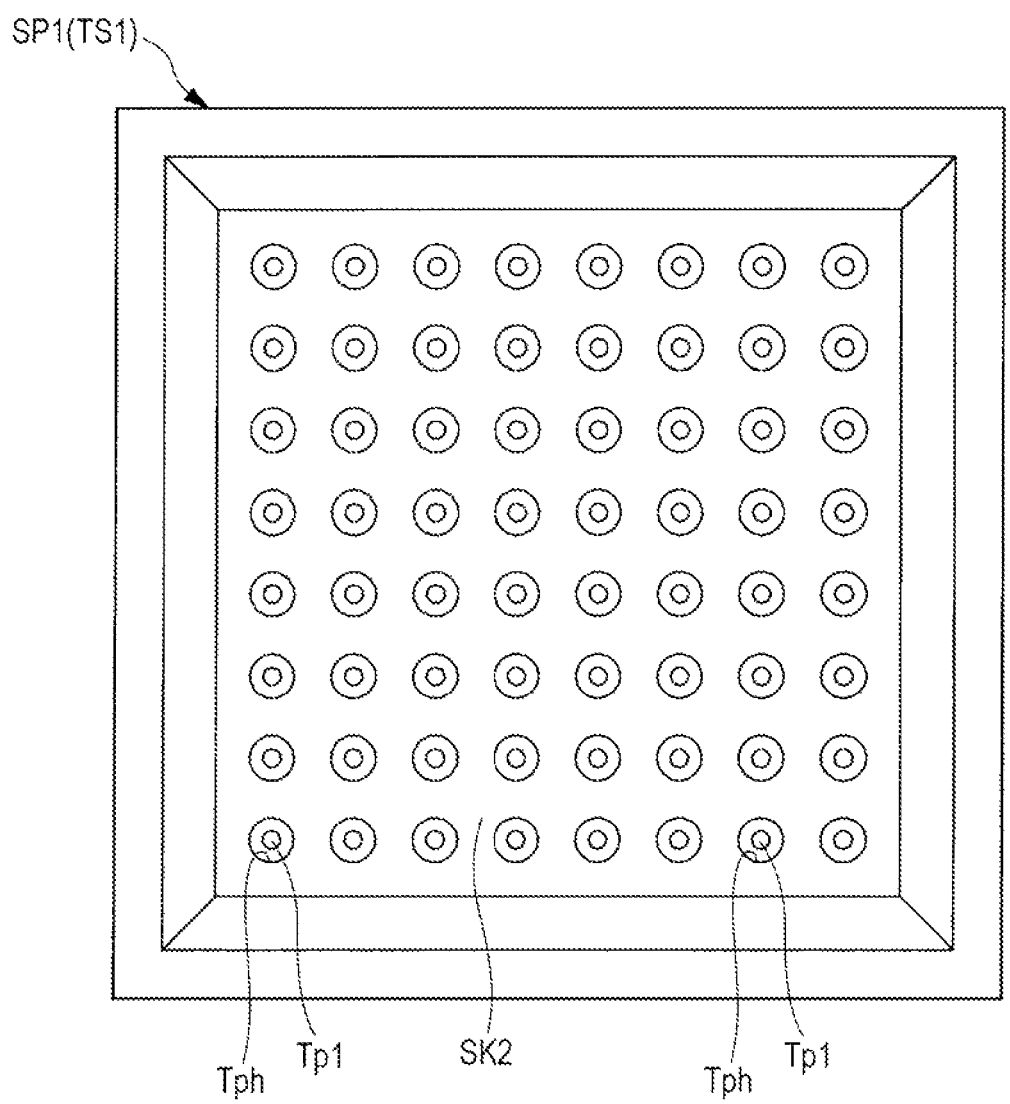
FIG. 14 is a plan view of the semiconductor package holding surface of the housing of a test socket shown in FIG. 13.

In the foregoing embodiment, the technique in the present invention is applied to the semiconductor device SP1 as the electronic device ED1 mounted over the mounting board MB1. As a variation of the foregoing embodiment, the technique can be applied to a test board TB1 which is used in the step for electrical testing such as semiconductor device functionality testing. Next, an embodiment will be described in which the technique is applied to the test step. FIG. 13 is an enlarged sectional view of an essential part of a semiconductor device placed over a test device in the test step (FIG. 11). FIG. 14 is a plan view of the semiconductor package bearing surface of a test socket housing shown in FIG. 13.

In the explanation given below, the semiconductor device SP1 before the inspection is designated as test object SP2 in order to distinguish work in process from a product which has passed the inspection, as shown in FIG. 13. The test object SP2 is structurally the same as the semiconductor device SP1 in the foregoing embodiment and its description is not repeated here.

The test step (FIG. 11) includes electrical tests such as continuity test, electrical characteristic test or functionality test in which an electrical current is applied to the assembled test object SP2 as shown in FIG. 13. As a high-temperature test after assembling of a semiconductor device, an acceleration test called "burn-in" is conducted and in some cases, burn-in includes a simple electrical test such as continuity test. However, the electrical test step in this variation is different from burn-in. Burn-in is a step to detect and eliminate early failures of a semiconductor device through acceleration by application of heat and voltage and is intended to enhance the ability to detect early failure mode defects in the final inspection. Therefore, in burn-in, generally in an environment of about 125° C., a voltage higher than the voltage at which the product is expected to be used is applied to the semiconductor device for several to ten hours. On the other hand, in the electrical test step according to this variation, testing is conducted to check whether or not electrical characteristics as designed are achieved within the product specification.

In the electrical test step according to this variation, first the test object SP2 is housed in a test socket TS2 of a test board TB1 and fixed as shown in FIG. 13. In the example shown in FIG. 13, the test board TB1 includes the mounting board MB1 in the foregoing embodiment, test socket TS1 fixed on the upper surface (test socket formation surface) Ma of the mounting board MB1, and capacitor CP1 mounted on the lower surface of the mounting board MB1.

The test socket TS1 has a function to fix the test object SP2 and electrically connect the test object SP2 and the mounting board MB1. More specifically, the test socket TS1 includes a housing SK1 to house the test object SP2 as a semiconductor package, and a plurality of test pins (test terminals) Tp1 arranged in the housing SK1. The test socket TS1 is fixed in a way to overlap the electrodes Mp1 on the upper surface Ma of the mounting board MB1 in the thickness direction and the test pins Tp1 are electrically connected with the electrodes Mp1.

In plan view, the housing SK1 has a dent in the center and the test object SP2 is held on a dented holding surface (semiconductor package holding surface) SK2. The test object SP2 may be held in various ways; in the example shown in FIG. 13, the test object SP2 is fixed in the housing SK1 by holding down the test object SP2 using a fixing jig SK3.

As shown in FIG. 14, a plurality of through holes Tph are made in the holding surface SK2 of the housing SK1 and a plurality of test pins Tp1 are arranged in the respective through holes Tph. The through holes Tph are arranged in a way to overlap the respective electrodes Mp1 (FIG. 5) in the thickness direction and as shown in FIG. 13, they penetrate the housing SK1 and a spacer member SK4 arranged between the housing SK1 and mounting board MB1. One end of a test pin Tp1 in each through hole Tph is connected with an electrode Mp1 and the other end of the test pin Tp1 protrudes from the holding surface SK2 of the housing SK1. Thus, the test pin Tp1 in the through hole Tph can electrically connect a solder ball SB as an external terminal of the test object SP2 with an electrode Mp1 of the mounting board MB1.

As schematically illustrated in FIG. 13, the mounting board MB1 is electrically connected with a tester TC1 having a test circuit for electrical testing. In the electrical test step according to this variation, a test signal and drive voltage are supplied from the tester TC1 to conduct electrical testing on the test object SP2.

In electrical testing, when the distance from the capacitor CP1 as a bypass capacitor to the circuit which consumes DC voltage for driving (for example, the core circuit CR1 shown in FIG. 6) is longer, the impedance component of the voltage supply path becomes larger and the voltage fluctuation suppression effect becomes smaller, as explained earlier in connection with the foregoing embodiment. In addition, when the distance of the power supply path connected with the bypass capacitor is larger, the inductance in the path becomes larger and particularly in a high frequency circuit, the margin to avoid the influence of anti-resonance becomes smaller. As a result, in the electrical test step, proper results may not be obtained depending on the degree of influence of voltage fluctuations or anti-resonance.

In this variation, the mounting board MB1 of the test board TB1 has the same structure as in the foregoing embodiment so that the reliability of the electrical test step is improved.

Variation 2

Figure 15:
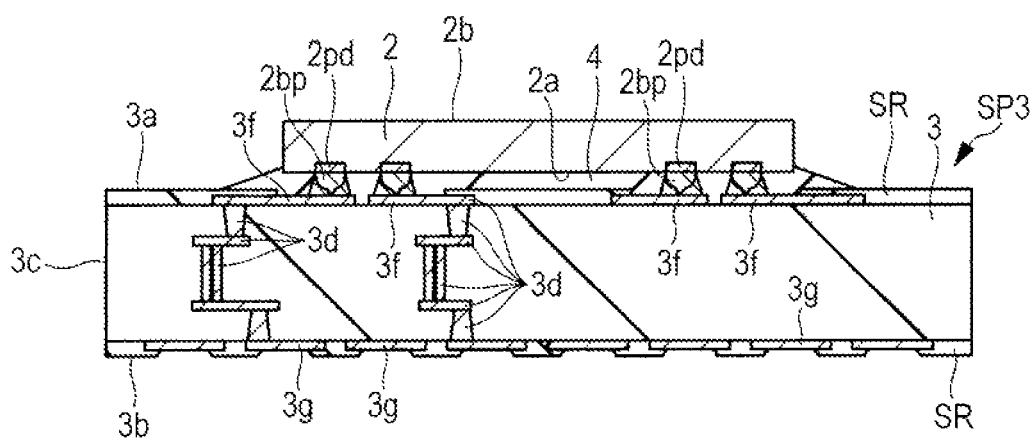
FIG. 15 is a sectional view showing a variation of the semiconductor device shown in FIG. 3.
Figure 16:
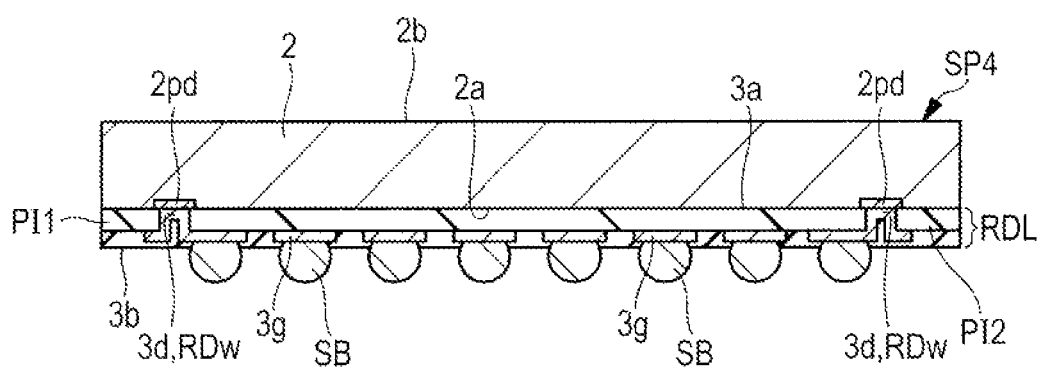
FIG. 16 is a sectional view showing another variation of the semiconductor device shown in FIG. 3.
Figure 17:
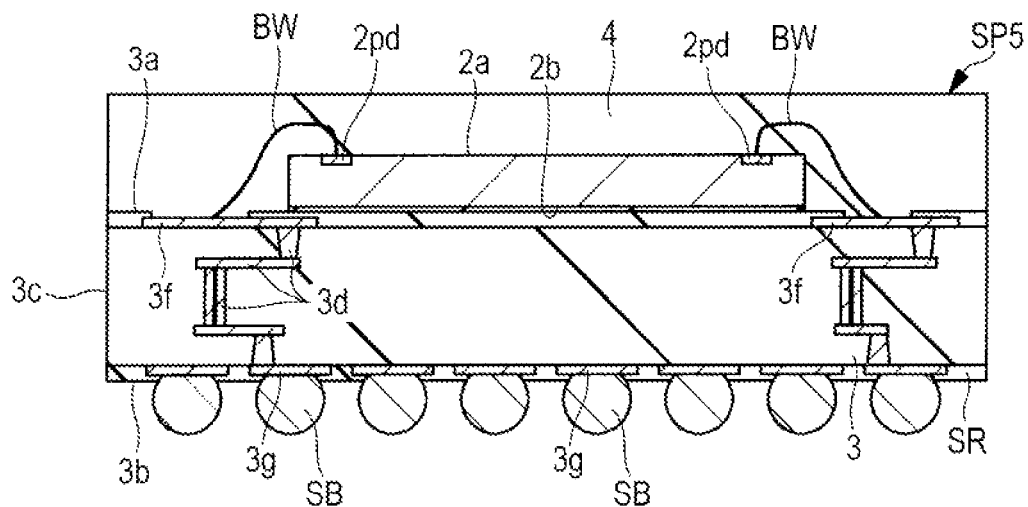
FIG. 17 is a sectional view showing another variation of the semiconductor device shown in FIG. 3.

The foregoing embodiment concerns a so-called BGA (Ball Grid Array) semiconductor package in which a plurality of solder balls SB are arranged in a matrix pattern on the mounting surface of the wiring board. However, there are many types of semiconductor package structures. FIGS. 15 to 17 are sectional views showing modified versions of the semiconductor device shown in FIG. 3.

For example, in a semiconductor device shown in FIG. 15, no solder balls (FIG. 3) are connected with it, and on the lower surface 3b of the wiring board 3 as the mounting surface, a plurality of lands 3g are exposed from the insulating film SR. This kind of semiconductor package is called an LGA (Land Grid Array) semiconductor package. The technique used in the foregoing embodiment can be applied to LGA semiconductor packages. Some LGA semiconductor packages use thin solder members on the surfaces of the lands 3g which are not ball-shaped like solder balls. In that case, the thin solder members correspond to the external terminals in the foregoing embodiment.

As a second example of variation 2 of the foregoing embodiment, a semiconductor device SP4 shown in FIG. 16 does not include a wiring board 3 like the semiconductor device SP1 shown in FIG. 3. The semiconductor device SP4 has a redistribution layer RDL which includes an upper surface 3a to face a semiconductor chip 2, a lower surface 3b as a mounting surface, a plurality of lands 3g formed on the lower surface 3b, and a plurality of wirings (redistribution wirings) to connect the lands 3g and the pads 2pd of the semiconductor chip 2 electrically.

Specifically the redistribution layer RDL includes an insulating film (polyimide film) PI1 covering the front surface 2a of the semiconductor chip 2. The insulating film PI1 has a plurality of openings and a plurality of pads 2pd are exposed in the respective openings. The redistribution layer RDL includes redistribution wirings RDw equivalent to the wirings 3d in the foregoing embodiment. The redistribution wirings RDw are arranged on the surface of the insulating film PI1 which is opposite to its surface facing the semiconductor chip 2.

In the example shown in FIG. 16, part of each of the redistribution wirings RDw is a land 3g. The redistribution wiring RDw also lies inside an opening in the insulating film PI1, and inside the opening, the redistribution wiring RDw is electrically connected with a pad 2pd of the semiconductor chip 2. The insulating film PI1 and redistribution wirings RDw are covered by an insulating film (polyimide film) PI2. The insulating film PI2 has a plurality of openings and in each of the openings, part of a redistribution wiring RDw which is equivalent to a land 3g is exposed from the insulating film PI2.

The lands 3g are connected with a plurality of solder balls SB. Though not shown, the solder balls SB are arranged in a matrix pattern in plan view, for example, like the lower surface 3b of the wiring board 3 shown in FIG. 4. The external terminals of the semiconductor device SP4 are positioned differently from the pads 2pd of the semiconductor chip 2 in plan view.

In short, the redistribution layer RDL has a function as a wiring board (interposer) which electrically connects the pads 2pd of the semiconductor chip 2 and the external terminals (lands 3g or solder balls SB) positioned differently from the pads 2pd in plan view.

In the semiconductor chip manufacturing process, the redistribution layer RDL is formed before dicing of the semiconductor wafer. Such a semiconductor package as the semiconductor device SP4 is called a WPP (Wafer Process Package). The redistribution layer RDL can be formed using a semiconductor element forming technique. This means that a micro-fabrication technique is easy to apply and the package thickness can be smaller than when the wiring board 3 (FIG. 3) is provided separately from the semiconductor chip 2. The planar size of the redistribution layer RDL is the same as that of the semiconductor chip 2, so the semiconductor device SP4 can be smaller than the semiconductor device SP1 shown in FIG. 3. The technique according to the foregoing embodiment can be applied to WPP semiconductor packages.

As a third example of variation 2, a semiconductor device SP5 shown in FIG. 17 is different from the semiconductor device SP1 shown in FIG. 3 in the following point: a so-called face-up mounting method is used in which the back surface 2b of the semiconductor chip 2 faces the upper surface 3a of the wiring board 3. When the face-up mounting method is employed, bonding fingers 3f are arranged in a way not to overlap the semiconductor chip 2 in the thickness direction, namely arranged around the semiconductor chip 2 and the pads 2pd and the bonding fingers 3f are electrically connected via wires BW. In order to protect the wires BW for electrical connection between the semiconductor chip 2 and wiring board 3, resin 4 is shaped so as to cover the semiconductor chip 2, wires BW and bonding fingers 3f. The technique according to the foregoing embodiment can be applied to semiconductor packages to which the face-up mounting method is applied.

For the semiconductor device SP, a wire bonding step is carried out after the semiconductor chip mounting step (FIG. 11). In the sealing step, the semiconductor chip 2, wires BW and bonding wires 3f are sealed with the resin 4.

Though not shown, the technique according to the foregoing embodiment can be applied not only to an area array semiconductor package as shown in FIG. 4 but also to a so-called peripheral type semiconductor package in which external terminals are arranged on the periphery of the mounting surface. However, in a peripheral type semiconductor package, inside the area where external terminals are arranged there is an area where no external terminals are arranged. This means that space for large-diameter through holes TH1 is easily available. Thus, in consideration of difficulty in providing space for large-diameter through holes TH1 as shown in FIGS. 3 and 9, the technique according to the foregoing embodiment is particularly effective for area array semiconductor packages.

Variation 3

Although the foregoing embodiment has two capacitors CP1 and one capacitor CP2 as shown in FIG. 2, the number of capacitors CP1 or CP2 is not limited. For example, when the semiconductor chip 2 includes many circuits, circuits to supply drive voltage to the circuits are needed. In this case, it is desirable that the voltage supply circuits each include a capacitor CP1 or capacitor CP2. In addition, for a circuit whose characteristics easily degrade due to voltage fluctuations, it is desirable to supply drive voltage through a through-hole wiring THm formed inside a through hole TH1 with a relatively large diameter like a through-hole wiring connected with the capacitor CP1 shown in FIG. 3.

Variation 4

Figure 18:
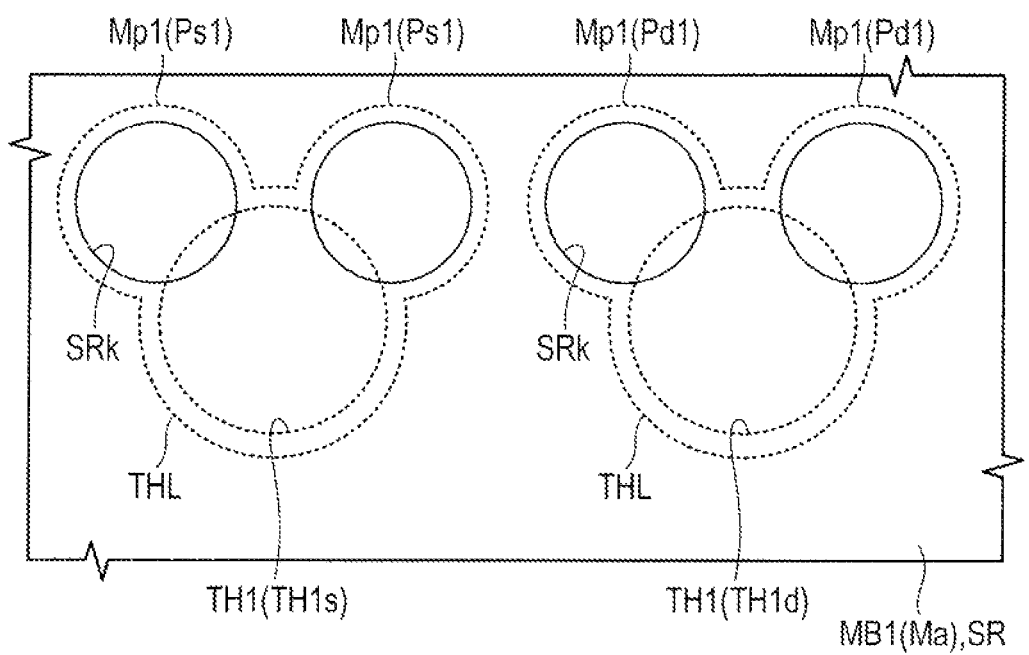
FIG. 18 is an enlarged plan view showing a variation of the example shown in FIG. 9.

In the foregoing embodiment, among the electrodes Mp1, four power supply voltage electrodes Pd1 (four reference voltage electrodes Ps1) are connected with one through hole TH1 as shown in FIG. 9. However, the number of electrodes Mp1 connected with one through hole TH1 is not limited to four and can be varied. In the example of variation shown in FIG. 18, among the electrodes Mp1, two power supply voltage electrodes Pd1 (two reference voltage electrodes Ps1) are connected with one through hole Th1. In this case, in order to prevent the through hole TH from being accidentally connected with another kind of electrode Mp1, it is desirable that the through hole TH1 be arranged on the periphery of the region in which a plurality of electrodes Mp1 are arranged. If there is a region in which the electrodes Mp1 shown in FIG. 5 are not arranged at regular intervals and the arrangement pitch is relatively large, it is desirable that the through hole TH1 be arranged in that region. If the through hole TH is so arranged, it is prevented from being accidentally connected with another type of electrode Mp1.

Variation 5

Any of the above variations of the foregoing embodiment may be combined without departing from the gist of the technical idea of the invention.

What is claimed is:
1. An electronic device comprising:
a first wiring board having a first surface, a plurality of first electrodes formed over the first surface, a second surface opposite to the first surface, a plurality of second electrodes formed over the second surface, and a plurality of holes extending from one of the first surface and the second surface to the other surface;
a semiconductor package including a semiconductor chip, a second wiring board electrically connected with the semiconductor chip, and a plurality of external terminals formed over a mounting surface of the second wiring board, the semiconductor package being fixed to the first surface of the first wiring board; and
a capacitor having a first terminal and a second terminal, and being mounted over the second surface of the first wiring board,
wherein the external terminals of the semiconductor package are electrically connected with the first electrodes of the first wiring board, respectively, wherein the first and second terminals of the capacitor are electrically connected with first and second terminal electrodes among the second electrodes of the first wiring board, respectively, wherein a thickness of the first wiring board is larger than that of the second wiring board, wherein the first electrodes include a plurality of power-supply-voltage-first-electrodes, a plurality of reference-voltage-first-electrodes and a plurality of signal-first-electrodes, wherein the holes include a power supply voltage hole, a reference voltage hole, and a plurality of signal holes, wherein a diameter of each of the power supply voltage hole and the reference voltage hole is larger than a diameter of each of the signal holes, wherein in plan view, the power supply voltage hole overlaps part of each of the power-supply-voltage-first-electrodes and the first terminal electrode, wherein in plan view, the reference voltage hole overlaps part of each of the reference-voltage-first-electrodes and the second terminal electrode, wherein the power-supply-voltage-first-electrodes are connected with one another via a power supply voltage wiring formed inside of the power supply voltage hole, wherein the reference-voltage-first-electrodes are connected with one another via a reference voltage wiring formed inside of the reference voltage hole, wherein the signal-first-electrodes are separated from one another, wherein each of the power-supply-voltage-first-electrodes is electrically connected with the first terminal electrode via the power supply voltage wiring, and wherein each of the reference-voltage-first-electrodes is electrically connected with the second terminal electrode via the reference voltage wiring.

2. The electronic device according to claim 1,
wherein the first electrodes of the first wiring board are arranged in a matrix pattern over the first surface of the first wiring board, and
wherein the external terminals of the semiconductor package are arranged in a matrix pattern over the mounting surface of the second wiring board.

3. The electronic device according to claim 1, wherein among the first electrodes, the power-supply-voltage-first-electrodes and the reference-voltage-first-electrodes are arranged in a way to overlap the semiconductor chip in a thickness direction of the first wiring board.

4. The electronic device according to claim 3, wherein the signal-first-electrodes among the first electrodes are arranged in a way not to overlap the semiconductor chip in the thickness direction of the semiconductor chip.

5. The electronic device according to claim 1,
wherein the power supply voltage wiring extends along a wall surface of the power supply voltage hole in a thickness direction of the first wiring board,
wherein the reference voltage wiring extends along a wall surface of the reference voltage hole in the thickness direction of the first wiring board, and
wherein an insulating material is embedded inside each of the power supply voltage wiring and the reference voltage wiring.

6. The electronic device according to claim 1, wherein an arrangement pitch between the signal holes and the power supply voltage hole and an arrangement pitch between the signal holes and the reference voltage hole are larger than an arrangement pitch between adjacent ones of the signal holes.

7. The electronic device according to claim 1, wherein an area of each of the second electrodes is larger than an area of each of the first electrodes.

8. The electronic device according to claim 1,
wherein the power-supply-voltage-first-electrodes are adjacent to each other and connected via a conductor filling the power supply voltage hole, and
wherein the reference-voltage-first-electrodes are adjacent to each other and connected via a conductor filling the reference voltage hole.

9. The electronic device according to claim 1,
wherein the semiconductor chip includes a first circuit and an input/output circuit which receives an electric signal from the first circuit or sends an electric signal to the first circuit, and
wherein the capacitor is a bypass capacitor connected with a path for supplying power supply voltage to the first circuit and a path for supplying reference voltage to the first circuit.

10. The electronic device according to claim 1, wherein the semiconductor chip is mounted over a chip mounting surface of the second wiring board opposite to the mounting surface of the second wiring board.

11. A test board comprising:
a first wiring board having a first surface, a plurality of first electrodes formed over the first surface, a second surface opposite to the first surface, a plurality of second electrodes formed over the second surface, and a plurality of holes extending from one of the first surface and the second surface to the other surface;
a test socket having a housing for housing a semiconductor package and a plurality of test terminals arranged in the housing, the test socket being fixed to the first surface of the first wiring board; and
a capacitor having a first terminal and a second terminal and being mounted over the second surface of the first wiring board,
wherein the test terminals of the test socket are electrically connected with the first electrodes of the first wiring board, respectively,
wherein the first and the second terminals of the capacitor are electrically connected with first and second terminal electrodes among the second electrodes of the first wiring boards, respectively,
wherein the first electrodes include a plurality of power-supply-voltage-first-electrodes, a plurality of reference-voltage-first-electrodes and a plurality of signal-first-electrodes,
wherein the holes include a power supply voltage hole, a reference voltage hole, and a plurality of signal holes,
wherein a diameter of each of the power supply voltage hole and the reference voltage hole is larger than a diameter of each of the signal holes,
wherein in plan view, the power supply voltage hole overlaps part of each of the power-supply-voltage-first-electrodes and the first terminal electrode,
wherein in plan view, the reference voltage hole overlaps part of each of the reference-voltage-first-electrodes and the second terminal electrode,
wherein the power-supply-voltage-first-electrodes are connected with one another via a power supply voltage wiring formed inside of the power supply voltage hole,
wherein the reference-voltage-first-electrodes are connected with one another via a reference voltage wiring formed inside of the reference voltage hole,
wherein the signal-first-electrodes are separated from each other, wherein each of the power-supply-voltage-first-electrodes is electrically connected with the first terminal electrode via the power supply voltage wiring, and wherein each of the reference-voltage-first-electrodes is electrically connected with the second terminal electrode via the reference voltage wiring.

12. The test board according to claim 11,
wherein the first electrodes of the first wiring board are arranged in a matrix pattern over the first surface of the first wiring board, and
wherein the test terminals of the test socket are arranged in a matrix pattern in the housing.

13. The test board according to claim 11,
wherein the power supply voltage wiring extends along a wall surface of the power supply voltage hole in a thickness direction of the first wiring board,
wherein the reference voltage wiring extends along a wall surface of the reference voltage hole in the thickness direction of the first wiring board, and
wherein an insulating material is embedded inside each of the power supply voltage wiring and the reference voltage wiring.

14. The test board according to claim 11, wherein an arrangement pitch between the signal holes and the power supply voltage hole and an arrangement pitch between the signal holes and the reference voltage hole are larger than an arrangement pitch between adjacent ones of the signal holes.

15. The test board according to claim 11, wherein an area of each of the second electrodes is larger than an area of each of the first electrodes.

16. The test board according to claim 11,
wherein the power-supply-voltage-first-electrodes are adjacent to each other and connected via a conductor filling the power supply voltage hole, and
wherein the reference-voltage-first-electrodes are adjacent to each other and connected via a conductor filling the reference voltage hole.

17. The test board according to claim 11,
wherein the semiconductor package housed in the housing has a semiconductor chip, a second wiring board electrically connected with the semiconductor chip, a plurality of lands formed over a mounting surface of the second wiring board, and a plurality of external terminals connected with the lands, and
wherein a thickness of the first wiring board is larger than that of the second wiring board.

18. A semiconductor device manufacturing method comprising the steps of:
(a) providing a first wiring board having a mounting surface;
(b) electrically connecting the first wiring board with a semiconductor chip and assembling a semiconductor package; and
(c) housing the semiconductor package in a housing of a test socket in a test board, electrically connecting a plurality of test terminals arranged in the housing of the test socket and a plurality of external terminals formed over the mounting surface of the first wiring board, and conducting an electrical test on the semiconductor package, the test board comprising:
a second wiring board having a first surface, a plurality of first electrodes formed over the first surface, a second surface opposite to the first surface, a plurality of second electrodes formed over the second surface, and a plurality of holes extending from one of the first surface and the second surface to the other surface;
the test socket having the housing for housing the semiconductor package and the test terminals arranged in the housing, the test socket being fixed over the first surface of the second wiring board; and
a capacitor having a first terminal and a second terminal and being mounted over the second surface of the second wiring board,
wherein the test terminals of the test socket are electrically connected with the first electrodes of the second wiring board, respectively,
wherein the first and second terminals of the capacitor are electrically connected with first and second terminal electrodes among the second electrodes of the second wiring board, respectively,
wherein the first electrodes include a plurality of power-supply-voltage-first-electrodes, a plurality of reference-voltage-first-electrodes, and a plurality of signal-first-electrodes,
wherein the holes include a power supply voltage hole, a reference voltage hole, and a plurality of signal holes,
wherein a diameter of each of the power supply voltage hole and the reference voltage hole is larger than a diameter of each of the signal holes,
wherein the power supply voltage hole overlaps part of each of the power-supply-voltage-first-electrodes and the first terminal electrode in plan view,
wherein the reference voltage hole overlaps part of each of the reference-voltage-first-electrodes and the second terminal electrode in plan view,
wherein the power-supply-voltage-first-electrodes are connected with one another via a power supply voltage wiring formed inside of the power supply voltage hole,
wherein the reference-voltage-first-electrodes are connected with one another via a reference voltage wiring formed inside of the reference voltage hole,
wherein the signal-first-electrodes are separated from each other,
wherein each of the power-supply-voltage-first-electrodes is electrically connected with the first terminal electrode via the power supply voltage wiring, and
wherein each of the reference-voltage-first-electrodes is electrically connected with the second terminal electrode via the reference voltage wiring.

* * * * *